(12) United States Patent
Takigawa et al.

(10) Patent No.: US 11,532,468 B2
(45) Date of Patent: Dec. 20, 2022

(54) SPUTTERING TARGET

(71) Applicant: SUMITOMO CHEMICAL COMPANY, LIMITED, Tokyo (JP)

(72) Inventors: Mikio Takigawa, Niihama (JP); Toshiaki Kuroda, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/112,242

(22) PCT Filed: Jan. 20, 2015

(86) PCT No.: PCT/JP2015/051395
§ 371 (c)(1),
(2) Date: Jul. 18, 2016

(87) PCT Pub. No.: WO2015/111576
PCT Pub. Date: Jul. 30, 2015

(65) Prior Publication Data
US 2016/0343551 A1    Nov. 24, 2016

(30) Foreign Application Priority Data
Jan. 21, 2014    (JP) .............................. JP2014-008740

(51) Int. Cl.
*H01J 37/34*    (2006.01)
*C23C 14/34*    (2006.01)

(52) U.S. Cl.
CPC ...... *H01J 37/3423* (2013.01); *C23C 14/3407* (2013.01); *H01J 37/3414* (2013.01); *H01J 37/3426* (2013.01); *H01J 2237/332* (2013.01)

(58) Field of Classification Search
CPC ............... H01J 37/3423; H01J 37/3414; H01J 37/3426; C23C 14/3407
See application file for complete search history.

(56) References Cited

U.S. PATENT DOCUMENTS 6,497,797 B1    12/2002    Kim
6,638,402 B2    10/2003    Marx et al.
(Continued)

FOREIGN PATENT DOCUMENTS

CN    201793723 U    4/2011
EP    1 087 033 A1    3/2001
(Continued)

OTHER PUBLICATIONS

Decision of Refusal dated Mar. 7, 2017 in the corresponding Japanese Patent Application No. 2015-558852 with its English translation.
(Continued)

*Primary Examiner* — John J Brayton
(74) *Attorney, Agent, or Firm* — Foley & Lardner LLP

(57) ABSTRACT

Objects of the present invention consist in achievement of both of elongation of life of a sputtering target as well as uniformity of a thickness of a resulting thin coating layer formed on a substrate during the period. The present invention provides a sputtering target comprising a target material, which is characterized in that the target material has a sputtering surface having a first area placed at the center, which is circular and flat; and a second area placed outside of the first area and concentrically with the first area, which has a ring shape, wherein the first area is positioned at a location lower than that of the second area by 15% of thickness of the second area at most, and the first area has a diameter which is ranging from 60% to 80% of a circumferential diameter of the sputtering surface.

15 Claims, 22 Drawing Sheets

(56) References Cited

U.S. PATENT DOCUMENTS

| | | | |
|---|---|---|---|
| 6,872,284 B2 | 3/2005 | Ivanov et al. | |
| 2004/0154914 A1 | 8/2004 | Cho et al. | |
| 2005/0115045 A1* | 6/2005 | Koenigsmann | H01J 37/3426 29/446 |
| 2012/0097534 A1* | 4/2012 | Takahashi | C23C 14/3407 204/298.12 |
| 2015/0047975 A1* | 2/2015 | West | H01J 37/3426 204/298.07 |
| 2015/0357169 A1* | 12/2015 | Yuan | B23K 35/24 204/298.13 |

FOREIGN PATENT DOCUMENTS

| | | |
|---|---|---|
| JP | H05-287524 A | 11/1993 |
| JP | H08-325719 A | 12/1996 |
| JP | 2000-265270 A | 9/2000 |
| JP | 2001-140063 A | 5/2001 |
| JP | 2002-517610 A | 6/2002 |
| JP | 4213030 B2 | 1/2009 |
| JP | 2012-522894 A | 9/2012 |
| WO | WO 99/63128 A1 | 12/1999 |
| WO | WO-2010/114823 A2 | 10/2010 |

OTHER PUBLICATIONS

Office Action issued in Japanese Patent Application No. 2015-558852 dated Nov. 22, 2016 with its machine English translation.

English-Language Translation of International Search Report issued in International Patent Application No. PCT/JP2015/051395 dated Apr. 28, 2015.

English-Language Translation of International Preliminary Report on Patentability issued in International Patent Application No. PCT/JP2015/051395 dated Jul. 26, 2016.

Notification of Reasons for Rejection issued in Japanese Patent Application No. 2015-558852 dated Jul. 26, 2016.

Extended European Search Report dated May 29, 2017 in corresponding European Patent Application No. 15741025.9.

Official Action and Search Report for Chinese Patent Application No. 201580005170.1 dated Dec. 18, 2017.

Taiwanese Office Action dated May 8, 2018 in corresponding application No. 104101813.

Japanese Office Action dated Jan. 8, 2019 in corresponding application No. 2017-251213.

Taiwanese Office Action dated Oct. 22, 2018 in corresponding application No. 104101813.

Israeli Office Action dated May 15, 2019 in corresponding application No. 246811.

Office Action dated Nov. 2, 2020 for corresponding South Korean Patent Application No. 10-2016-7019560.

Office Action dated Feb. 26, 2021 for corresponding Korean Patent Application No. 10-2016-7019560.

Notice of Final Rejection dated Apr. 12, 2021 for corresponding South Korean Patent Application No. 10-2016-7019560.

Office Action issued in corresponding Korean Patent Application No. 10-2021-7013891, dated Sep. 1, 2022.

* cited by examiner

SPUTTERING TARGET

TECHNICAL FIELD

The present invention relates to sputtering targets.

BACKGROUND ART

Sputtering is a method wherein an inert gas such as argon is introduced in vacuo, and a direct current at a high voltage is applied between a substrate and a target material to make a collision between the inert gas which is plasma (or ionized) and the target material, which gas strikes the target material to release a target atom contained therein, and then, the released atom is deposited on the substrate to from a thin coating layer on the substrate.

For example, sputtering such as magnetron sputtering is generally known, wherein deposition rate is increased by adopting a magnet to the backside opposite to the sputtering surface of the target material. Herein, the sputtering surface is a surface that the inert gas which is plasma (or ionized) comes into a collision on the target material.

The sputtering target to be used for such sputtering generally comprises a target material having a flat surface in a disk shape. The sputtering surface is circular.

Herein, in order to elongate its life, for example, Patent Literature 1 discloses a sputtering target having a long life.

PRIOR ART DOCUMENTS

Patent Literatures

Patent Literature 1: JP 4213030 B

SUMMARY OF INVENTION

Problems to be Solved by the Invention

However, in this technical field, development of the sputtering target having a further long life is desired. Because the elongated life of the sputtering target improves the operation efficiency of the sputtering apparatus, and further improves the deposition efficiency on the substrate.

It is believed that the sputtering target having a long life can be achieved by entirely increasing the thickness of the target material thereof.

However, if the thickness of the target material is entirely increased, the distance between the sputtering surface of the target material and the substrate (hereinafter, which distance may be referred to as a "TS distance") will be small. Therefore, at the initial period of the sputtering, the uniformity of the thickness of the resulting thin coating layer formed on the substrate is decreased.

Moreover, if the thickness of the target material is namely increased, and then, the sputtering is conducted, with passage of time, spot(s) wherein the erosion of the target material is considerably large (particularly, at an area around the circumference of the target material) and spot(s) wherein the consumption of the target material is considerably small (particularly, at an area around the center of the target material) are formed. Sputtering over a long period makes the difference between them significant, and uniformity of the thickness of the resulting thin coating layer formed on the substrate is significantly deteriorated.

Thus, in order to obtain a sputtering target with a long life, even if the thickness of the target material was namely increased, it was difficult to ensure the uniformity of the thickness of the resulting thin coating layer formed on the substrate at any stage between the initial period of the sputtering and the ending period thereof.

Herein, regarding the above-described problems, objects of the present invention consist in achievements of both of elongated life of the sputtering target and uniformity of the thickness of the resulting thin coating layer formed on the substrate through its life.

Means for Solving the Problems

As results of intensive researches, the present inventors found out that, at a sputtering surface of a target material of a sputtering target, formation of a first area placed at the center, which is circular and flat, and formation of a second area placed outside of the first area and concentrically with the first area, which has a ring shape, such that the first area is positioned at a location lower than that of the second area by 15% of thickness of the second area at most, and such that the first area has a diameter which is ranging from 60% to 80% of a circumferential diameter of the sputtering surface, can achieve a long life of 1800 kWh or more, as an integral power consumption, and can ensure an excellent uniformity of the thickness of the resulting thin coating layer formed on the substrate during the period. Therefore, the present invention is completed.

The present invention provides sputtering targets as described below. The disclosure of the present specification is not limited to those sputtering targets below.

[1]
A sputtering target comprising a target material, which is characterized in that
   the target material has a sputtering surface having
   a first area placed at the center, which is circular and flat; and
   a second area placed outside of the first area and concentrically with the first area, which has a ring shape,
      wherein the first area is positioned at a location lower than that of the second area by 15% of thickness of the second area at most, and the first area has a diameter which is ranging from 60% to 80% of a circumferential diameter of the sputtering surface.

[2]
The sputtering target according to Item [1], which is characterized in that the first area is positioned at a location lower than that of the second area by from 4% to 12% of thickness of the second area.

[3]
The sputtering target according to Item [1] or [2], which is characterized in that the first area of the target material has a thickness from 20 mm to 30 mm.

[4]
The sputtering target according to any one of Items [1]-[3], which is characterized in that the second area of the target material has a thickness from 25 mm to 35 mm.

[5]
The sputtering target according to any one of Items [1]-[4], which is characterized in that the target material has no step at its peripheral part.

[6]
The sputtering target according to any one of Items [1]-[5], which is characterized in that the target material is composed of aluminum or aluminum alloy.

Effects of the Invention

According to the present invention, both of an elongated life of a sputtering target, particularly a long life of 1800 kWh or more, and an excellent uniformity of a thickness of a resulting thin coating layer formed on a substrate during the period can be achieved.

DESCRIPTION OF EMBODIMENTS

Figure 1:
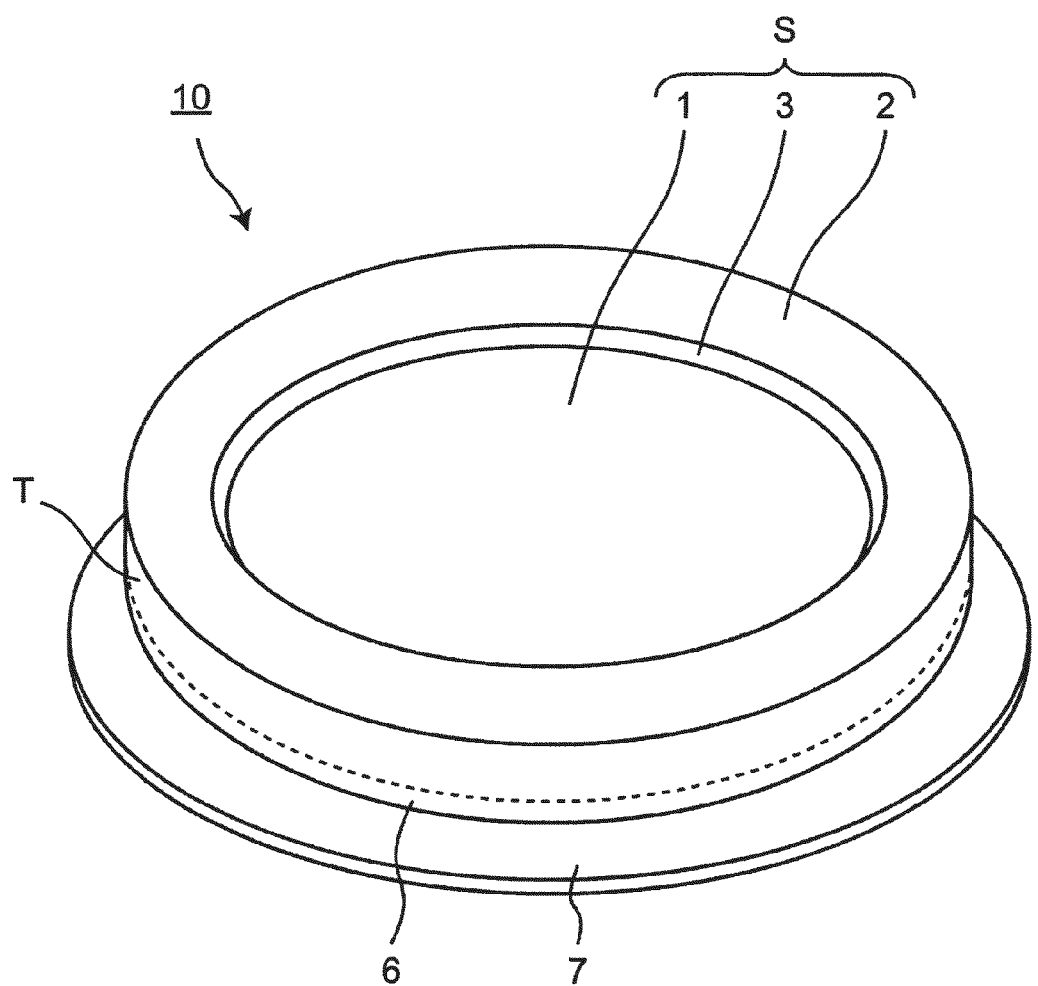
FIG. 1 is a perspective view illustrating one embodiment of a sputtering target according to the present invention.

Sputtering targets according to the present invention are explained in detail with specific embodiments described below with referring to the drawings appended thereto. The sputtering targets according to the present invention are not limited to those embodiments below.

Sputtering Target

Figure 2:
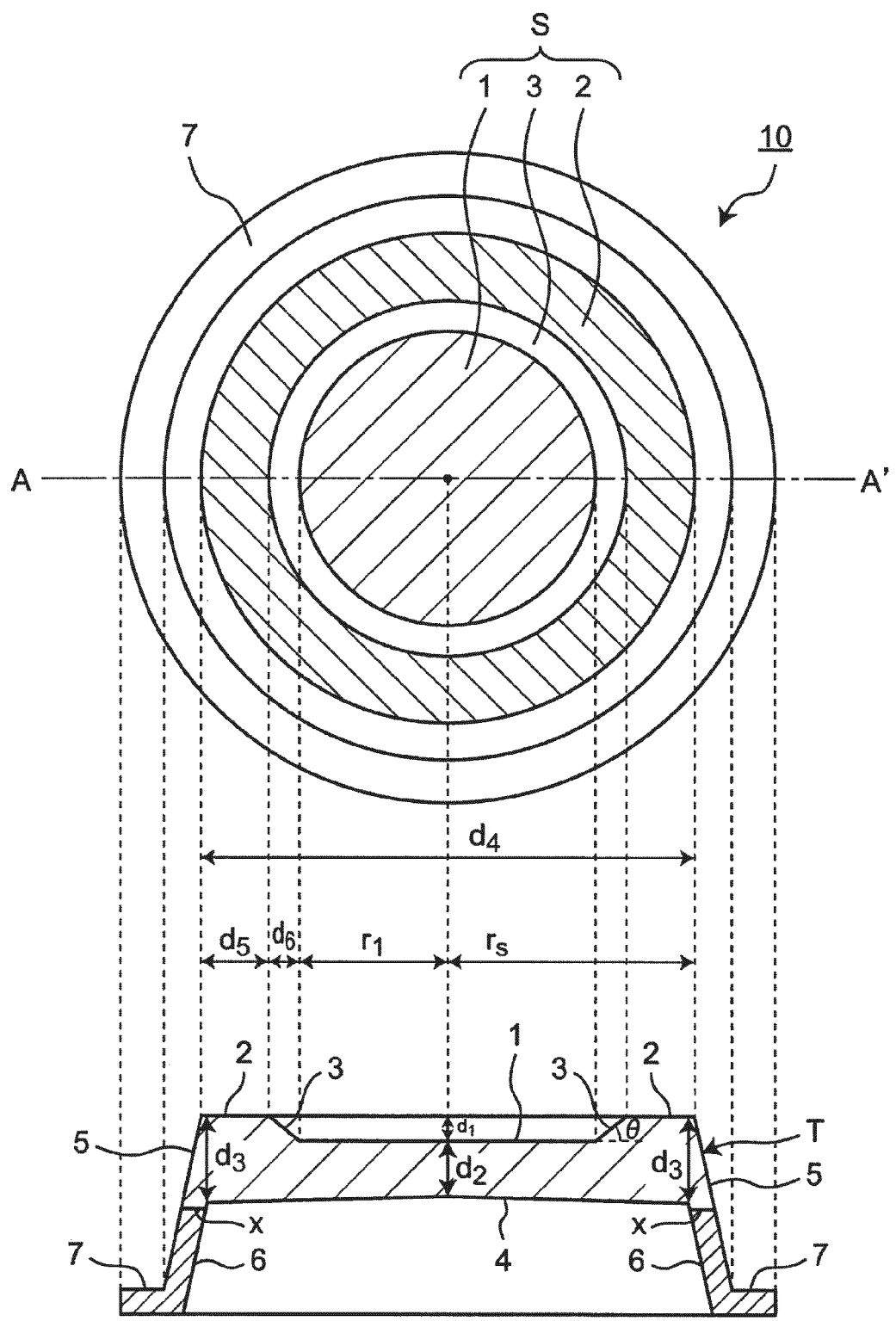
FIG. 2 is a top and cross-sectional view schematically illustrating one embodiment of a sputtering target according to the present invention.

FIGS. 1 and 2 schematically illustrate one embodiment of a sputtering target according to the present invention. Herein, the sputtering target according to the present invention, which is shown in FIGS. 1 and 2, is schematically illustrated as an example, the actual sizes and configurations thereof are as defined in the present specification.

As shown in FIGS. 1 and 2, the sputtering target 10 according to the present invention comprises a target material T.

The target material T comprises a sputtering surface S for receiving an inert gas which is plasma (or ionized) by the sputtering. The sputtering surface S comprises
  a first area 1 placed at the center, which is circular and flat; and
  a second area 2 placed outside of the first area 1 and concentrically with the first area 1, which has a ring shape.

In the illustrated embodiment, the first area 1 and the second area 2 are shown in planes, respectively, but they are not limited to these planes, respectively.

In the present invention, the first area 1 may be positioned at a location lower (in a perpendicular and downward direction) than that of the second area 2 by 15% of thickness of the second area at most. Preferably, the first area 1 and the second area 2 may be positioned in parallel from each other.

Moreover, in the illustrated embodiment, an intermediate area 3 may exist between the first area 1 and the second area 2. The first area 1 and the second area 2 can be continuously united by the intermediate area 3.

Therefore, in the sputtering target 10 of the illustrated embodiment, the target material T comprises a sputtering surface S composed of the first area 1, the second area 2, and the intermediate area 3 between them.

As shown in the top view of FIG. 2, the sputtering surface S comprises a circumference in a circular shape, wherein the circumference of the sputtering surface S consists with the outer circumference of the second area 2. The first area 1 has a diameter which is ranging from 60% to 80%, preferably from 60% to 75%, more preferably from 65% to 75%, yet more preferably from 67% to 72% of a circumferential diameter of the sputtering surface S.

The sputtering target 10 according to the present invention has the above-described structure. Therefore, for example, during the sputtering operation which employs a sputtering apparatus such as a magnetron sputtering apparatus, 1800 kWh or more of a long life can be achieved, and a thin coating layer can be formed on a substrate during a period from 0 to 1800 kWh or more, which coating layer has uniformity of the coating thickness similar or superior to that of the conventional coating layer.

Hereinafter, the target material T is further described in detail, which is used in the sputtering target 10 according to the present invention.

Target Material T

Target material T can be manufactured with a material selected from the group consisting of a metal such as aluminium (Al), chromium (Cr), iron (Fe), tantalum (Ta), titanium (Ti), zirconium (Zr), tungsten (W), molybdenum (Mo), niobium (Nb) and the like, and an alloy thereof. The materials to produce the target material T are not limited thereto.

As the material for the target material T, aluminum is preferable. It is particularly preferable to use aluminum having a purity of, for example, 99.99% or more, and more preferably 99.999% or more.

As a material for the target material T, aluminium alloy is also preferable. The aluminium alloy may contain a metal such as copper and silicon. The content thereof is, for example, 2% by weight or less, preferably 1% by weight or less.

As shown in FIGS. 1 and 2, the target material T comprises a first area 1 which is circular and flat, a second area 2, and an optional intermediate area 3 between them, which can form a sputtering surface S.

As illustrated in a plan view of FIG. 2, the sputtering surface S has a diameter $d_4$ within a range, for example, from 260 mm to 325 mm.

A back surface 4 (i.e., a surface opposite to the sputtering surface S) of the target material T preferably has a circular circumstance. The circumferential diameter is, for example, within a range from 330 mm to 345 mm.

Moreover, as shown in the figure, the back surface 4 of the target material T may be formed as a cavity in a conical shape having an apex at the center of the circle. The depth of the cavity at the apex is generally ranging from 1 mm to 3 mm.

A peripheral part (or a side surface) 5 of the target material T is a surface which is linear and continuous from an edge of the second area 2 to a part x jointed with a support member 6. As the illustrated embodiment, the peripheral part 5 extending from the edge of the second area 2 to the part x jointed with the support member 6 may have a tapered surface with the size in the radial direction being increasing, or a cylindrical surface. Herein, regarding the present invention, the peripheral part having "no step" means that the peripheral part of the target material has a continuous surface, and any step is not intentionally formed thereon.

Herein, the joint part x of the target material T is a ring-shaped projection (in a perpendicular and downward direction) as shown in the figure. The height is not particularly limited. Alternatively, the joint part x of the target material T may form a plane with the back surface 4 of the target material T (i.e., it may be a flushed surface).

Thus, the peripheral part 5 of the target material T has no step. Such peripheral part 5 having no step is provided as a side surface of the target material. Thereby, uniformity of the coating thickness formed from the sputtering target is improved. As a result, life of the target material is improved.

Herein, as a different embodiment of the peripheral part 5, it may continuously have a plurality of taper surfaces with various angles, but with no step. It may have a rounded surface as protruded in the upward direction.

First Area 1

As shown in FIG. 2, the first area 1 is located at the center of the sputtering surface S, which is an area having a circular and flat shape, positioned at a location lower (in a perpendicular and downward direction) than that of the second area 2.

Herein, regarding the present invention, the first area 1 being "flat" means that unevenness is not substantially formed over the first area 1. Herein, the phrase of that the "unevenness is not substantially formed" over the first area 1 means that any concavo-convex is not intentionally formed on the first area 1. However, an arithmetic average roughness: Ra=about 7 μm may be acceptable as a surface roughness.

In the shown embodiment, the first area 1 is illustrated as a plane. It may be flat as mentioned above. However, the first area 1 is not limited to such plane.

Herein, the first area 1 is circular, and has a radius $r_1$, which is, for example, ranging from 95 mm to 130 mm, preferably from 95 mm to 125 mm, more preferably from 105 mm to 125 mm, yet more preferably from 108 mm to 117 mm.

The distance $d_1$ between the first area 1 and the second area 2 (in a perpendicular direction) is up to 15%, preferably from 4% to 12%, more preferably from 4% to 8% of the thickness $d_3$ of the second area 2. The distance $d_1$ between the first area 1 and the second area 2 is represented by an actual size, which is, for example, 4 mm or less, more preferably from 1 mm to 3 mm, yet more preferably from 1 mm to 2 mm.

If the distance $d_1$ is no more than 15% of the thickness $d_3$ of the second area, the uniformity of the thickness of the thin coating layer formed on the substrate can be improved.

In the first area 1, the thickness $d_2$ of the target material T is a thickness of a conventional standard target (having a diameter of a sputtering surface: 8 inches; and a life: 1200 kWh), which is 19.6 mm or more, for example, from 20 mm to 30 mm, preferably from 23 mm to 28 mm.

Herein, if the back surface 4 of the target material T has a cavity in a conical shape having an apex at the center as illustrated in the figure, the distance $d_2$ is represented by the thickness at the center of the target material T, which is the smallest thickness.

Thus, according to the present invention, even if the thickness $d_2$ of the first area of the target material T is set at no less than the thickness of the conventional standard target (19.6 mm), no less than 1800 kWh of a long life is achieved, and an excellent uniformity of the coating thickness can be given to the resulting thin coating layer formed on a substrate during that period.

Second Area 2

As shown in FIG. 2, the second area 2 outside the first area is an area in a ring shape, which is placed concentrically with the first area.

In FIG. 2, the second area 2 is illustrated as a plane. However, the second area 2 is not limited to that plane. For example, the second area 2 may be curved and protruded in the upward direction.

The thickness $d_3$ of the second area 2 of the target material T, which corresponds to the thickness of the target material T ranging, for example, from 25 mm to 35 mm, preferably from 25 mm to 30 mm.

Herein, as illustrated in the figure, if the back surface 4 of the target material T has a cavity in a conical shape having an apex at the center, the thickness $d_3$ is represented by the thickness at the point having the maximum thickness of the target material T except for the part x jointed with the support member 6.

Thus, according to the present invention, even if the target material T has the thickness $d_3$ which is larger than the thickness, which is 19.6 mm, of the conventional standard target (having a diameter of a sputtering surface: 8 inches, and a life: 1200 kWh), no less than 1800 kWh of a long life can be achieved, and an excellent uniformity of the coating thickness can be given to the resulting thin coating layer formed on a substrate during that period.

Herein, the ring width $d_5$ of the second area 2 (i.e., difference between the outer radius and the inner radius of the second area 2) is ranging, for example, from 25 mm to 65 mm, preferably from 30 mm to 65 mm, more preferably from 30 mm to 60 mm, yet more preferably from 36 mm to 54 mm.

The ring width $d_5$ within the above-defined range can provide a long life to a sputtering target, and the results such as an excellent uniformity of the coating thickness can be obtained.

(Intermediate Area 3 Between First Area and Second Area)

In the embodiment illustrated in FIG. 2, an intermediate area 3 exists between the first area 1 and the second area 2. By the intermediate area 3, the first area 1 and the second area 2 are continuously united, and preferably, the first area 1 and the second area 2 are linearly united.

For example, as shown in the figure, in the case that the first area 1 and the second area 2 are linearly united, the first area 1 is positioned at the location lower than that of the second area 2, as described above, as shown in the cross-sectional view of FIG. 2. Therefore, the intermediate area 3 uniting them forms an inclined plane in a mortar shape (i.e., a tapered surface). Herein, the sputtering surface S has a cavity in a reverse trapezoid shape in its cross-section, wherein the bottom is the first area 1 (see the cross-sectional view of FIG. 2).

In the illustrated embodiment, an angle $\theta$ of the inclination of the intermediate area 3 (i.e., angle formed between the intermediate area 3 and the first area 1 as shown in the cross-sectional view of FIG. 2) is not particularly limited, if it is smaller than the vertical angle ($\theta=90°$). The angle $\theta$ of the inclination is preferably ranging from 10° to 80°, more preferably from 15° to 60°. If the angle $\theta$ of the inclination is within the above-defined range, any abnormal discharge which may occur at the corner can be suppressed during the sputtering. Thereby, the life of the sputtering target can be elongated, and uniformity of the thickness of the thin coating layer formed on a substrate can be improved.

The width $d_6$ of the intermediate area 3 as shown in Figure (i.e., distance between the first area 1 and the second area 2 (in a horizontal direction)) is ranging, for example, from 0.1 mm to 23.0 mm, preferably from 0.1 mm to 18.0 mm, more preferably from 0.5 mm to 7.5 mm. With the value of the width $d_6$ of the intermediate area being larger, the angle $\theta$ of the inclination of the intermediate area 3 is smaller (i.e., the inclination of the intermediate area 3 becomes gentle). As described above, any abnormal discharge at the corner can be suppressed. Herein, as described above, the diameter (or a radius $r_1$) of the first area 1 is within a range from 60% to 80% of diameter (or radius $r_5$) of the sputtering target S. Thereby, an elongated life of a sputtering target, and the results such as an excellent uniformity of the coating thickness, prevention of decrease in yield due to adhesion of rough particles can be obtained.

Support Member 6

As shown in FIGS. 1 and 2, the sputtering target 10 according to the present invention may further comprise a support member 6 to be fixed on a sputtering apparatus such as a magnetron sputtering apparatus or the like, on which the above-described target material T is placed.

The support member 6 comprises a metal, which may be manufactured with a material selected from a group consisting of, for example, a metal such as aluminium, copper, iron, chromium, nickel, and an alloy thereof.

The support member 6 is mainly composed of a ring part for placing the above-described target material T thereon. The support member 6 may further comprise a flange part 7 which can fix it to a sputtering apparatus. It is preferable that the ring part and the flange part 7 of the support member 6 are integrally manufactured with the above-described material by machining, etc.

The thickness of the ring part (i.e., wall thickness) is not particularly limited to, but ranging, for example, from 5 mm to 20 mm, preferably from 10 mm to 15 mm. The thickness of the ring part may be uniform, or may not be uniform. Therefore, approaching to the flange part 7, the ring part may be configured such that the thickness thereof is increased.

Generally, the target material T is placed on the top surface of the ring part of the support member 6. It is preferable that the target material T is attached to the ring part of the support member 6, at the joint part x, by a welding such as an electron beam (EB) welding. Herein, it is preferable that the peripheral part outside the ring part of the support member 6 and the peripheral part 5 outside the target material T are formed to be a flushed plane.

A plurality of holes may be formed through the flange part 7 to allow the flange to be fixed to a sputtering apparatus with fasteners such as bolts therethrough.

The thickness of the flange part 7 is not particularly limited to, but ranging, for example, from 5 mm to 15 mm, preferably from 8 mm to 12 mm, more preferably from 10 mm to 11 mm. It is preferable that the thickness of the flange part 7 is uniform.

The height of the support member 6 is not particularly limited to, but ranging, for example, from 10 mm to 30 mm, preferably from 20 mm to 29 mm, more preferably from 25 mm to 29 mm.

The total height of the sputtering target (i.e., distance from the top surface of the second area of the target material T to the back surface of the flange part 7 of the support member 6) is not particularly limited to, but ranging, for example, from 45 mm to 70 mm, preferably from 50 mm to 65 mm, more preferably from 50 mm to 60 mm.

Method for Producing Sputtering Target

In a method for producing a sputtering target according to the present invention, for example, materials for the target material T are initially mixed, melted and casted to form an ingot which is referred to as a slab, and then such ingot is rolled, and subjected to a heat treatment, and subsequently, cut out as a disk in any desired dimensions to give a preformed article for the target material.

Subsequently, the preformed article for the target material, and the support member 6 which has been previously manufactured can be joined by welding, preferably EB welding, and then, the preformed article for the target material can be formed in the desired shape by machining to produce a sputtering target 10 according to the present invention.

Herein, the method for producing the sputtering target 10 according to the present invention is not limited to the method described above.

Sputtering Apparatus

A sputtering apparatus, in which the sputtering target according to the present invention can be used, is not particularly limited. A commercially available sputtering apparatus can be employed without any limitations.

Among others, a magnetron sputtering apparatus is preferably employed. In the magnetron sputtering apparatus, an inert gas such as argon, which is plasma (or ionized), can be captured by utilizing a magnet. Therefore, from the target material, the target atom can be efficiently struck out, and the deposition rate on a substrate can be improved.

As the magnetron sputtering apparatus, an apparatus which is referred to as "Endura" manufactured by Applied Materials, Inc. is preferably employed. Among others, an apparatus utilizing a magnet in Dura-type is particularly preferable.

Substrate

A substrate, on which a thin coating layer can be formed by using of the sputtering target according to the present invention and the above-described sputtering apparatus, is not particularly limited. For example, a metal wafer such as silicon and copper; an oxide wafer such as zinc oxide and magnesium oxide; a glass substrate such as quarts and Pyrex; a resin substrate, and the like, can be used.

Size of the substrate is not particularly limited. The diameter thereof is ranging, for example, from 100 mm to 450 mm, preferably from 150 mm to 300 mm, more preferably 200 mm.

Life of Sputtering Target According to the Present Invention

The sputtering target according to the present invention has a long life of 1800 kWh or more, preferably 2000 kWh or more, as an integral power consumption. It is 1.5 times or more of the life (1200 kWh) of the sputtering target having the target material in the conventional standard configuration.

In the sputtering target according to the present invention, achievement of such long life is caused by the fact that the sputtering target of the present'invention comprises the target material T having the above-described configuration and dimensions (see FIG. 2).

Among others, this achievement is particularly caused by the fact that the sputtering surface S of the target material T has the first area 1 and the second area 2, wherein the first area 1 is positioned at a location lower than that of the second area 2 by 15% of thickness of the second area 2 at most (e.g., 4 mm or more), and wherein the first area 1 placed at the center of the sputtering surface S has a diameter which is ranging from 60% to 80% of the circumferential diameter of the sputtering surface S.

Moreover, the peripheral part 5 of the target material T has no step, and/or the angle θ of the inclination of the intermediate area 3 is 80° or less, which may contribute to achieve such elongated life of the sputtering target.

Uniformity of Thickness of Thin Coating Layer on Substrate Formed by Sputtering Target According to the Present Invention The uniformity of the thickness of the thin coating layer on the substrate formed by the sputtering target according to the present invention is based on the maximum value (max) and the minimum value (min) of the coating thickness t (μm) determined according to the following equation:

$$t = R_v/R_s \times 10^6$$

wherein $R_s$ (Ω/□) represents a sheet resistance of a thin coating layer, which is measured on a given point among 49 points on the thin coating layer formed on a substrate, and $R_v$ (Ω·m) represents a volume resistivity of an existing thin coating layer.

The uniformity of the thickness can be determined according to the following equation:

$$(max-min)/(max+min) \times 100 \qquad (\%)$$

wherein, in the case of an aluminium thin coating layer, $R_v$ is $2.9 \times 10^{-8}$ (Ω·m).

Figure 9:
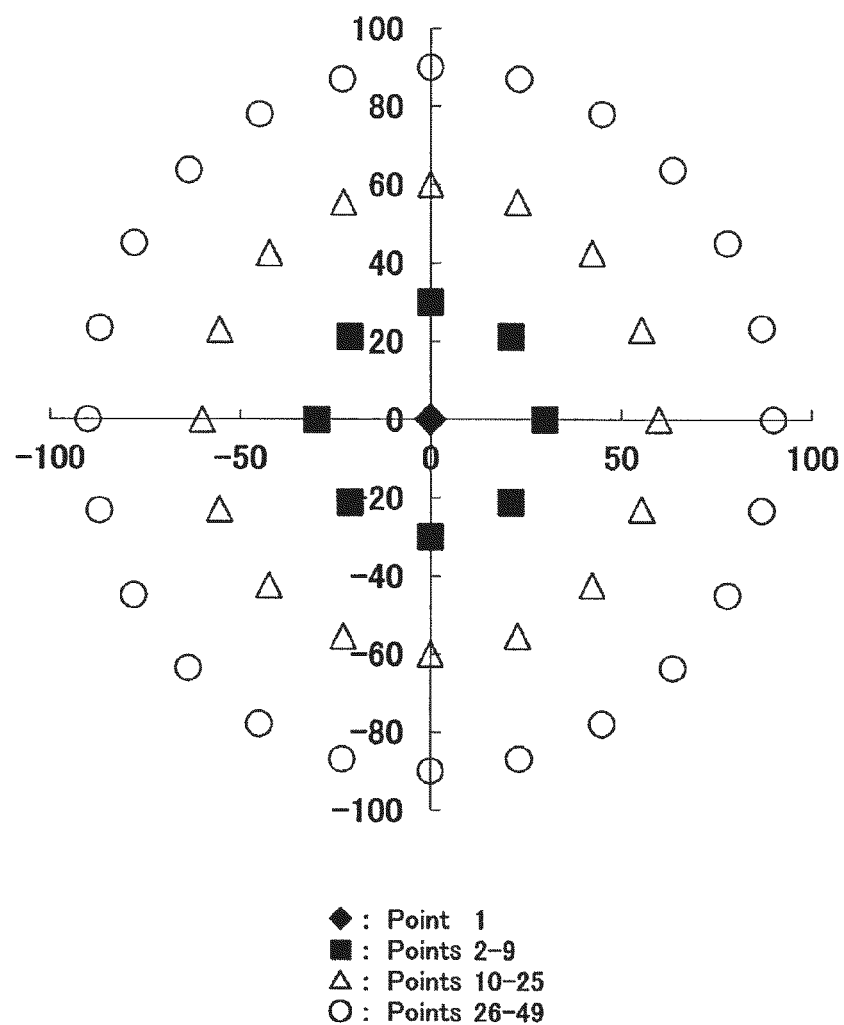
FIG. 9 is a schematic view illustrating points (Points 1-49) to measure sheet resistances (Ω/□) at 49 points over a thin coating layer on a substrate having a diameter of 200 mm.

Herein, the sheet resistances (Ω/□) of the thin coating layer can be measured, for example, by using of Omnimap RS35c manufactured by KLA-Tencor Corporation. For example, in the case that a substrate having a diameter of 200 mm is employed, the given 49 points, on which measurements are conducted, are illustrated in FIG. 9, for example, wherein, apart from 10 mm from the circumference of the substrate (Edge Exclusion=10 mm), one point at the center (Point 1); 8 points in a distance of 30 mm from the center, which are equally distributed in a circumferential direction of the substrate (Points 2-9); 16 points in a distance of 60 mm from the center, which are equally distributed in a circumferential direction of the substrate (Points 10-25); and 24 points in a distance of 90 mm from the center, which are equally distributed in a circumferential direction of the substrate (Points 26-49), which are totally 49 points.

In the present invention, the above-described uniformity of the coating thickness is less than 4%, preferably less than 3%, and more preferably less than 2%. Even in the initial period of the sputtering (e.g., within a range from 0 to 300 kWh), the uniformity of the coating thickness being less than 4%, preferably less than 3%, and more preferably less than 2% can be achieved. Moreover, even if a long period being 1800 kWh or more, preferably 2000 kWh has past, the uniformity of the coating thickness is less than 4%, preferably less than 3%, more preferably less than 2%.

Therefore, according to the present invention, in addition to the elongated life of the sputtering target, such excellent uniformity of the coating thickness can be achieved, even if 1800 kWh or more is spent, even in the initial period of the sputtering operation.

In the following Examples, the sputtering targets according to the present invention are further described in detail. The present invention is not limited to the following sputtering targets.

EXAMPLES

Example 1

To aluminium having a purity of 99.999% or more, 0.5% by weight of copper was added to produce a mixture. The mixture was melted and casted to produce an ingot (slab). The ingot was rolled, subjected to a heat treatment, and then, cut out to produce a disk to give a preformed article for a target material.

Thus preformed article for the target material and a support member 6 in the shape illustrated in FIG. 2 were united by electron beam (EB) welding. Subsequently, the preformed article for the target material was subjected to a machining to be formed into a shape of the target material T illustrated in FIG. 2 to produce a sputtering target according to the present invention. The dimensions of the target material T are as follows, respectively.

$r_s$: 159.57 mm
$r_1$: 112.00 mm
$d_1$: 1.65 mm (5.98% of thickness $d_3$ of the second area 2)
$d_2$: 23.94 mm
$d_3$: 27.60 mm
$d_4$: 319.14 mm
$d_5$: 44.57 mm
$d_6$: 3.00 mm
θ: 29°
$r_1/r_s$: 70.2%

Figure 3:
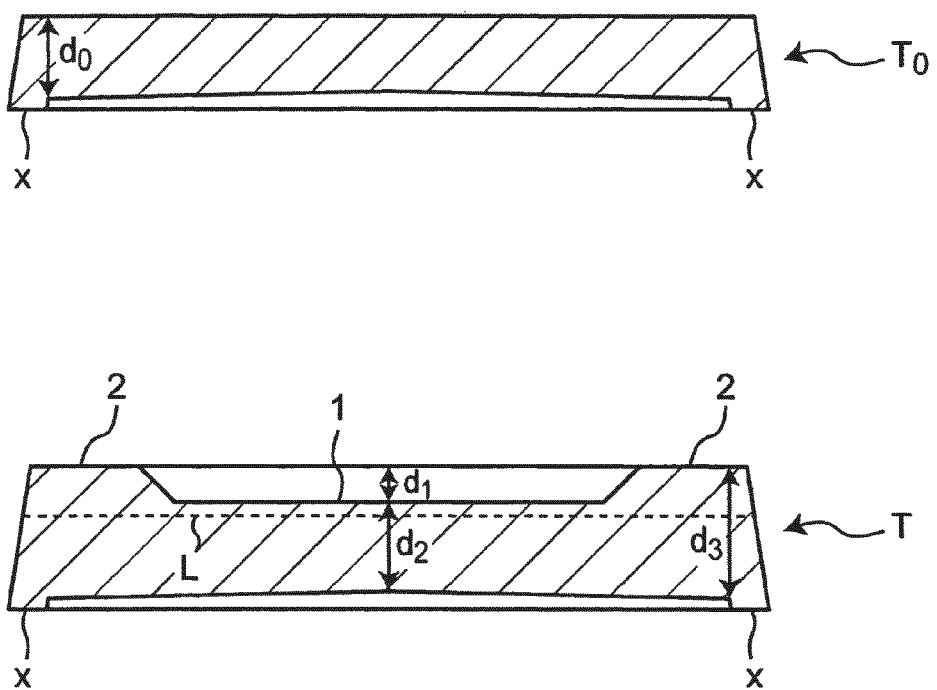
FIG. 3 is a cross-sectional view schematically illustrating a target material $T_0$ of a sputtering target in a standard configuration and a target material T of a sputtering target according to the present invention, respectively.

Total height of the sputtering target (distance from the top surface of the second area to the back surface of the flange part of the support member): 56.26 mm Reference Example In the same manner as described in Example 1, a sputtering target having the target material $T_0$ in the standard configuration illustrated in FIG. 3 was produced. Herein, a support member of the target material $T_0$, which had the similar shape to that of Example 1, was employed.

The shape of the target material $T_0$ in the standard configuration is as illustrated in the cross-sectional view of FIG. 3. The dimensions are as follows, respectively.

Diameter of the sputtering surface: 323.42 mm Maximum thickness $d_0$ except for the joint part x of target material $T_0$: 19.61 mm Total height of the sputtering target (distance from the top surface of the target material $T_0$ to the back surface of the flange part of the support member): 48.26 mm Comparative Example 1

Figure 4:
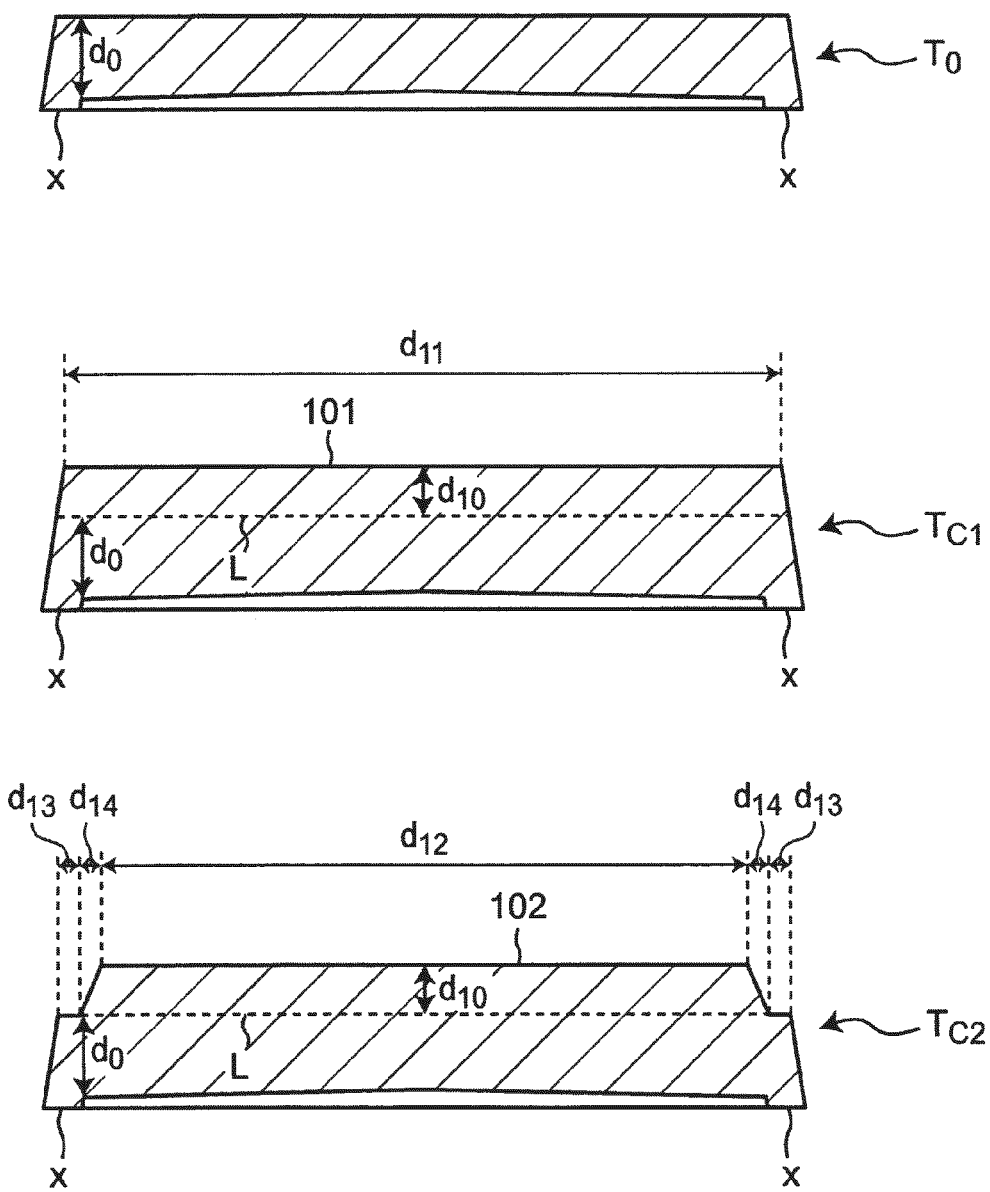
FIG. 4 is a cross-sectional view schematically illustrating a target material $T_0$ of a sputtering target in a standard configuration as well as target materials $Tc_1$ and $Tc_2$ of sputtering targets according to Comparative Examples 1 and 2, respectively.
Figure 6:
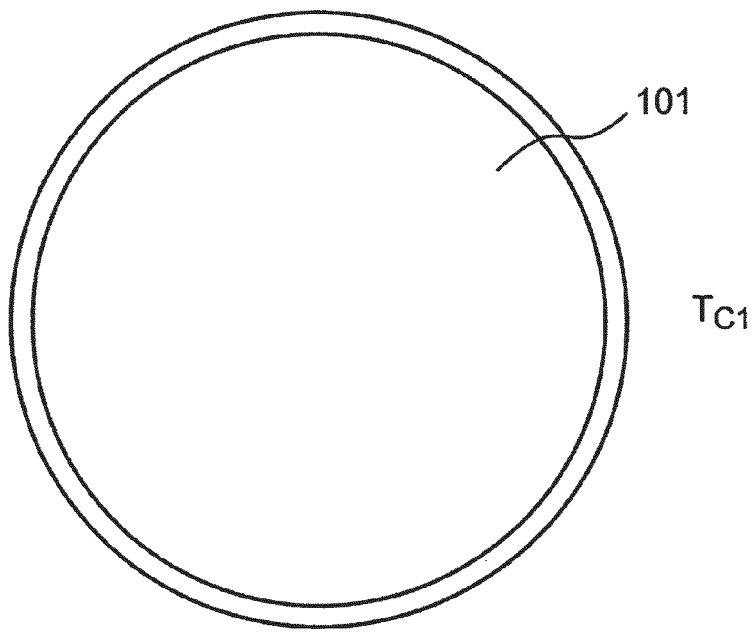
FIG. 6 is a top view illustrating target materials $Tc_1$ and $Tc_2$ of sputtering targets according to Comparative Examples 1 and 2, respectively.
Figure 6:
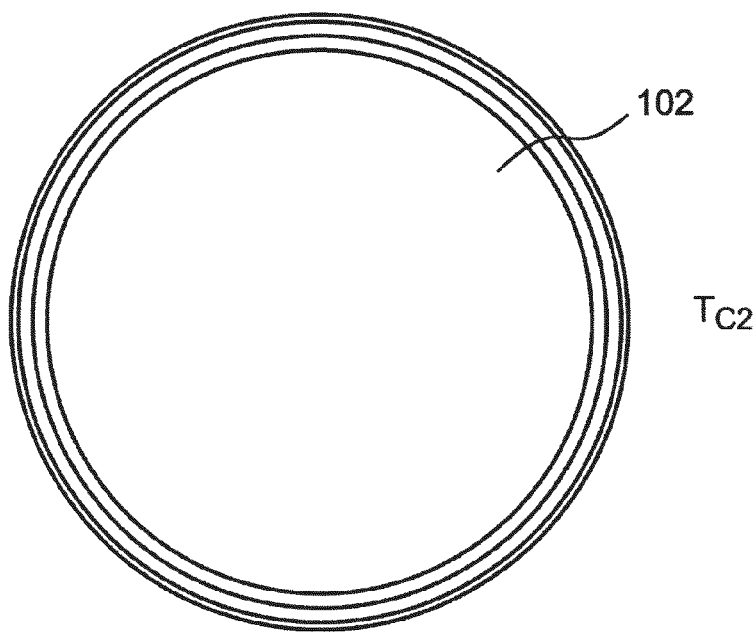

In the same manner as described in Example 1, a sputtering target having the target material $Tc_1$ in the shape illustrated in the cross-sectional view of FIG. 4 and in the top view of FIG. 6 was produced. Herein, a support member for the target material $Tc_1$, which had the similar shape to that of Example 1, was employed.

The target material $Tc_1$ is a target material which corresponds to the target material $T_0$ of Reference Example in the standard configuration wherein the thickness thereof is entirely uniform and increased by $d_{10}$ (see the cross-sectional view of FIG. 4). In the target material $Tc_1$ of FIG. 4, the dotted line L represents the position of the sputtering surface of the target material $T_0$ of the Reference Example in the standard configuration.

The dimensions of the target material $Tc_1$ are as follows, respectively.

Thickness of the target material $Tc_1$ ($d_0+d_{10}$): 27.61 mm
$d_0$: 19.61 mm
$d_{10}$: 8.00 mm
Diameter $d_{11}$ of the sputtering surface (diameter of planar area 101): 319.14 mm Total height of the sputtering target (distance from the top surface of the target material $T_{c1}$ to the back surface of the flange part of the support member): 56.26 mm Comparative Example 2

In the same manner as described in Example 1, a sputtering target having the target material $Tc_2$ in the shape illustrated in the cross-sectional view of FIG. 4 and in the top view of FIG. 6 was produced. Herein, a support member for the target material $Tc_2$, which had the similar shape to that of Example 1, was employed.

The target material $T_{c2}$ is a target material which corresponds to the target material $Tc_1$ of Comparative Example 1 wherein the peripheral part has a step (see the cross-sectional view of FIG. 4).

The dimensions of the target material $Tc_2$ are as follows, respectively.

Thickness of the target material $Tc_2$ ($d_0+d_{10}$): 27.61 mm
$d_0$: 19.61 mm
$d_{10}$: 8.00 mm
$d_{12}$ (diameter of central planar area 102): 260.00 mm
$d_{13}$ (width of step): 16.71 mm
$d_{14}$ (width of inclination): 15.00 mm Total height of the sputtering target (distance from the highest top surface of the target material $Tc_2$ to the back surface of the flange part of the support member): 56.26 mm Comparative Example 3

Figure 5:
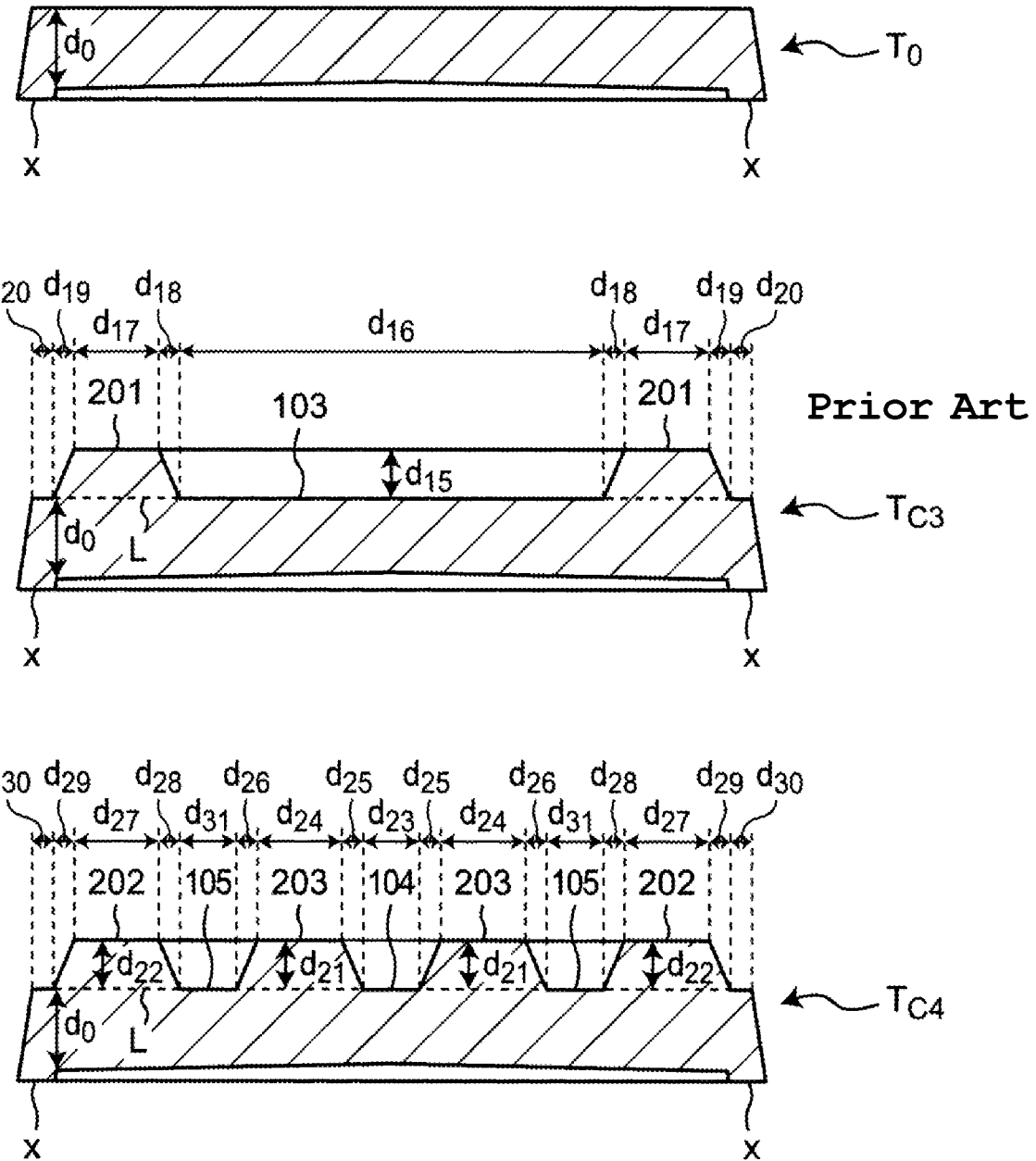
FIG. 5 is a cross-sectional view schematically illustrating a target material $T_0$ of a sputtering target in a standard configuration as well as target materials $Tc_3$ and $Tc_4$ of sputtering targets according to Comparative Examples 3 and 4, respectively.
Figure 7:
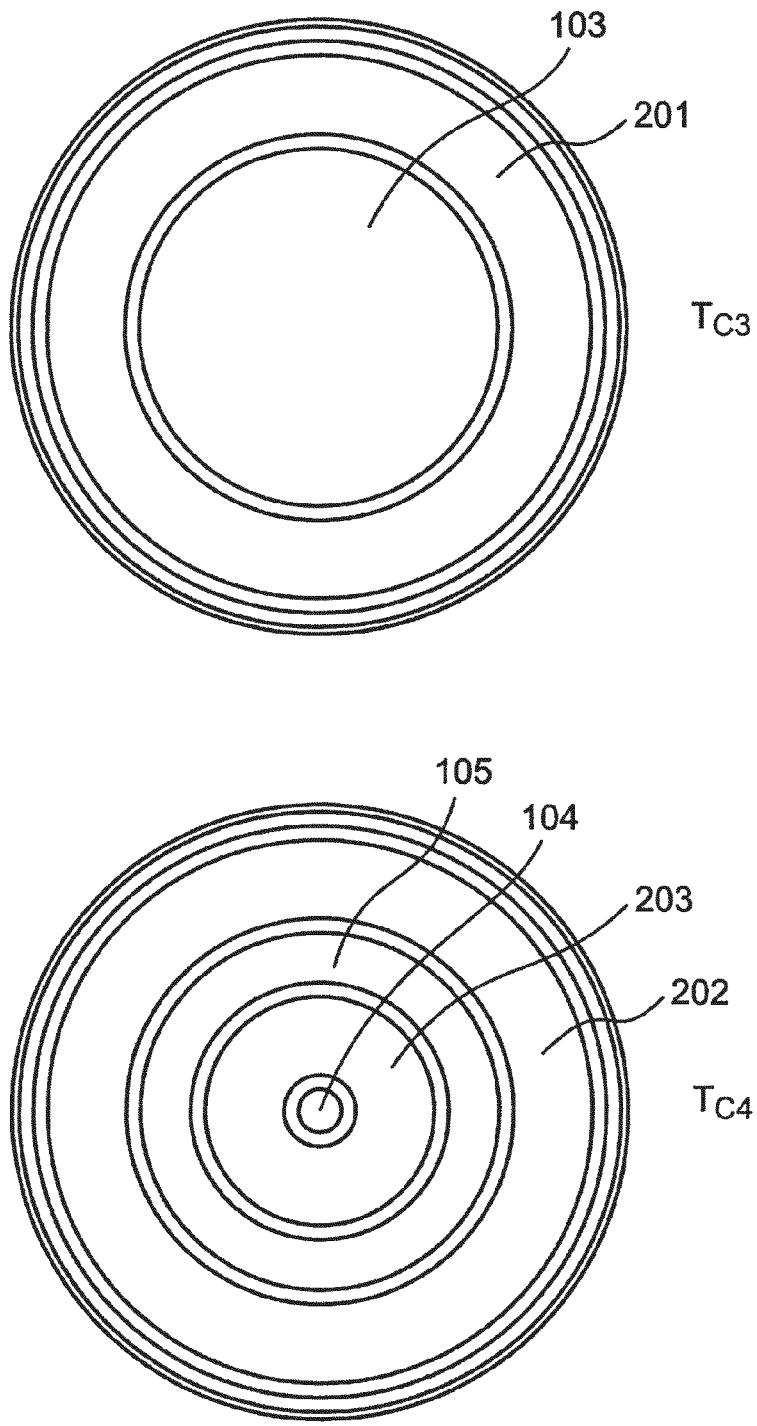
FIG. 7 is a top view illustrating target materials $Tc_3$ and $Tc_4$ of sputtering targets according to Comparative Examples 3 and 4, respectively.

In the same manner as described in Example 1, a sputtering target having the target material $Tc_3$ in the shape illustrated in the cross-sectional view of FIG. 5 and in the top view of FIG. 7 was produced. Herein, a support member for the target material $Tc_3$, which had the similar shape to that of Example 1, was employed.

The target material $Tc_3$ is a target material which corresponds to the target material $T_0$ of the Reference Example in the standard configuration wherein the sputtering surface has a planar area 201 in a ring shape, which is protruded and formed concentrically (see the cross-sectional view of FIG. 5).

The dimensions of the target material $Tc_3$ are as follows, respectively.

$d_0$: 19.61 mm
$d_{15}$ (height of ring): 8.00 mm (29.0% of thickness of target material ($d_0+d_{15}$))
$d_{16}$ (diameter of central planar area 103): 200.00 mm
$d_{17}$ (ring width of planar area 201 in ring shape): 15.00 mm
$d_{18}$ (width of inner inclination of ring): 15.00 mm
$d_{19}$ (width of outer inclination of ring): 15.00 mm
$d_{20}$ (width of step): 16.71 mm Total height of the sputtering target (distance from the highest top surface of the target material $Tc_3$ to the back surface of the flange part of the support member): 56.26 mm Comparative Example 4

In the same manner as described in Example 1, a sputtering target having the target material $Tc_4$ in the shape illustrated in the cross-sectional view of FIG. 5 and in the top view of FIG. 7 was produced. Herein, a support member for the target material $Tc_4$, which had the similar shape to that of Example 1, was employed.

The target material $Tc_4$ is a target material which corresponds to the target material $T_0$ of the Reference Example in the standard configuration wherein the sputtering surface has double-ring shaped planar areas 202 (outer) and 203 (inner), which are protruded and formed concentrically (see the cross-sectional view of FIG. 5).

The dimensions of the target material $Tc_4$ are as follows, respectively.

$d_0$: 19.61 mm
$d_{21}$ (height of inner ring): 8.00 mm (29.0% of thickness of target material ($d_0+d_{21}$ (=$d_0+d_{22}$)))
$d_{22}$ (height of outer ring): 8.00 mm (29.0% of thickness of target material ($d_0+d_{21}$ (=$d_0+d_{22}$)))
$d_{23}$ (diameter of central planar area 104): 10.00 mm
$d_{24}$ (ring width of inner ring): 20.00 mm $d_{25}$ (width of inner inclination of inner ring): 15.00 mm
$d_{26}$ (width of outer inclination of inner ring): 15.00 mm
$d_{27}$ (ring width of outer ring): 15.00 mm
$d_{28}$ (width of inner inclination of outer ring): 15.00 mm
$d_{29}$ (width of outer inclination of outer ring): 15.00 mm
$d_{30}$ (width of step): 16.71 mm
$d_{31}$ (width of outer planar area 105): 45.00 mm Total height of the sputtering target (distance from the highest top surface of the target material $T_{c4}$ to the back surface of the flange part of the support member): 56.26 mm Comparative Example 5

Figure 8:
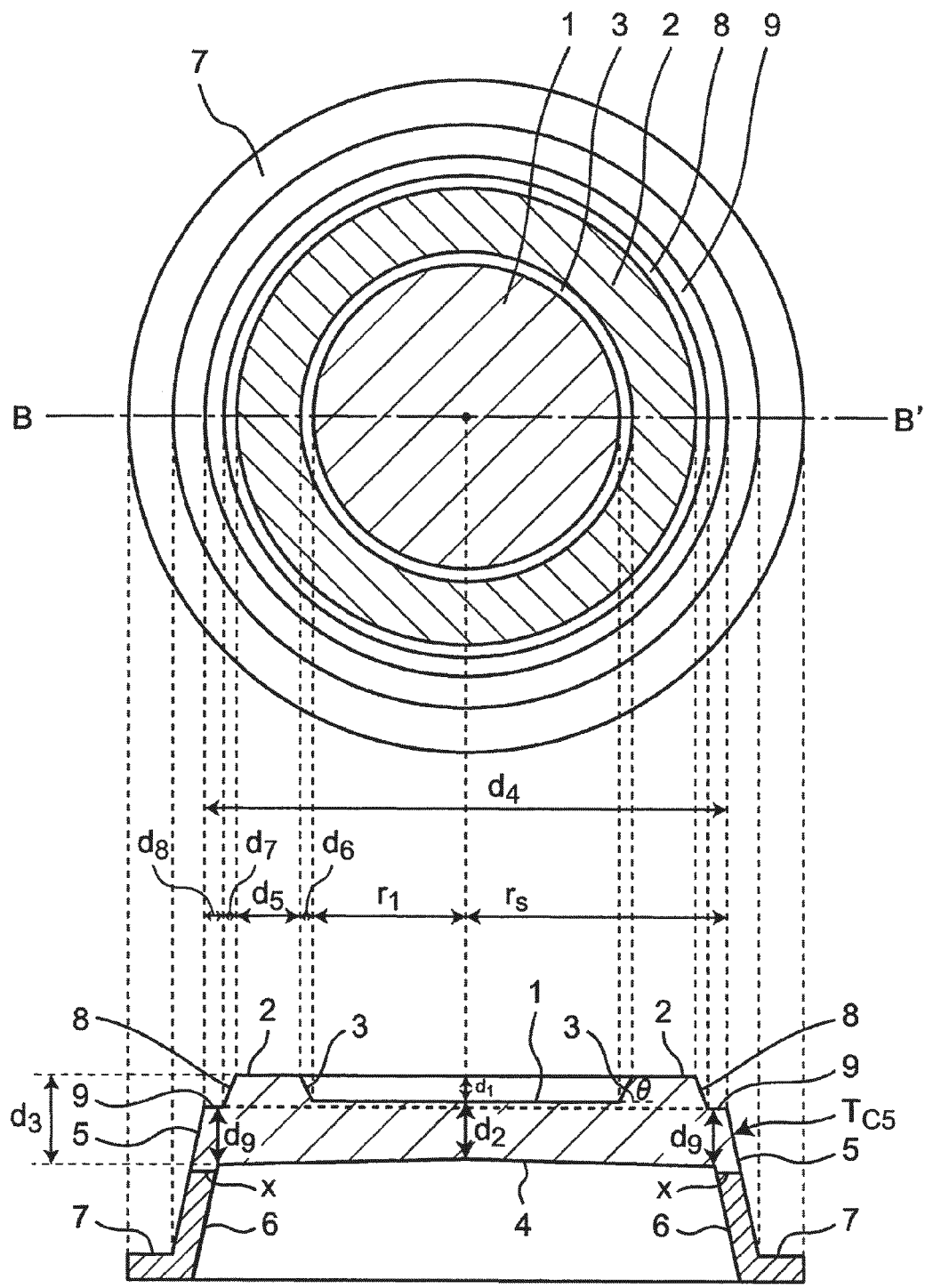
FIG. 8 is a top and cross-sectional view schematically illustrating a sputtering target according to Comparative Example 5.

In the same manner as described in Example 1, a sputtering target having the target material $Tc_5$ in the shape illustrated in the top and cross-sectional views of FIG. 8 was produced. Herein, a support member for the target material $Tc_5$, which had the same shape to that of Example 1, was employed.

The target material $Tc_5$ has a configuration which mainly corresponds to that of the target material T of Example 1 (FIG. 2) wherein sizes of $d_1$ and $d_2$ are altered, and a step 9 is formed on the peripheral part 5 (see the cross-sectional view of FIG. 8).

The dimensions of the target material $Tc_5$ are as follows, respectively.
$r_s$: 161.71 mm
$r_1$: 105.00 mm
$d_1$: 4.49 mm (16.3% of thickness $d_3$ of the second area)
$d_2$: 21.11 mm
$d_3$: 27.60 mm
$d_4$: 323.42 mm
$d_5$: 15.00 mm
$d_6$: 10.00 mm
$d_7$: 15.00 mm
$d_8$: 16.71 mm
$d_9$: 19.61 mm
θ: 24°
$r_1/r_s$: 64.9%

Total height of the sputtering target (distance from the top surface of the second area 2 to the back surface of the flange part of the support member): 56.26 mm Comparative Example 6

In the same manner as described in Example 1 except for the sizes of $r_1$ and $d_5$ were altered, a sputtering target having the target material $Tc_6$ was produced. Herein, a support member for the target material $Tc_6$, which had the similar shape to that of Example 1, was employed.

The dimensions of the target material $Tc_6$ are as follows, respectively.
$r_s$: 159.57 mm
$r_1$: 52.00 mm
$d_1$: 1.65 mm (5.98% of thickness $d_3$ of the second area 2)
$d_2$: 23.94 mm
$d_3$: 27.60 mm
$d_4$: 319.14 mm
$d_5$: 104.57 mm
$d_6$: 3.00 mm
θ: 29°
$r_1/r_s$: 32.6%

Total height of the sputtering target (distance from the top surface of the second area to the back surface of the flange part of the support member): 56.26 mm Sputtering A magnetron sputtering apparatus (Endura 5500 (magnet: Dura-type) manufactured by Applied Materials, Inc.) and each of the sputtering targets of Example, Reference Example and Comparative Example were employed. On a substrate having a diameter of 200 mm (a silicon substrate manufactured by LG Siltron), a thin coating layer was formed under the following conditions.

Sputtering Conditions
Power: 10600 W
Inert gas: argon
Pressure in chamber: 2.75 mTorr
Temperature of substrate: 300° C.
Distance between target and substrate (TS distance): 35 mm (for target materials: T and $Tc_1$-$Tc_6$) or 43 mm (for target material: $T_0$)

Evaluation of Sputtering Target

Each of the sputtering targets of Example, Reference Example and Comparative Example was subjected to the sputtering operation under the above-described conditions over a range from 0 to 2000 kWh. Life of each of the sputtering targets was evaluated.

Herein, under the above-described sputtering conditions, with respect to each of the sputtering targets of Example, Reference Example and Comparative Example, sheet resistances (Ω/□) of the thin coating layer formed on the substrate were measured on the 49 points illustrated in FIG. 9 at a given integral power consumption. Thereby, coating thickness at every point was calculated. By using of the maximum value (max) and the minimum value (min), uniformity of the coating thickness was determined according to the formula: (max−min)/(max+min)×100(%). The uniformity of the thickness of the thin coating layer on the substrate formed by each of the sputtering targets was evaluated.

Simultaneously, the coating thicknesses were calculated from the sheet resistances (Ω/□) measured at the above-described 49 points. Therewith, standard deviations σ (sigma) were calculated, and then, values of 1σ% (percent 1-sigma) were calculated. Herein, the standard deviation σ can be calculated according to the following equation:

$$\sigma = \sqrt{\frac{\sum_{i=1}^{n}(X_i - X_{AVE})^2}{n}}$$

wherein n represents a number of date, and $X_{AVE}$ represents an average value.

Moreover, a ratio of the coating thickness at 1 point at the central part (Point 1); 8 points around the center (Points 2-9 (in a distance from the center: 30 mm)); 16 points around them (Points 10-25 (in a distance from the center: 60 mm)); and 24 points around them (Points 26-49 (in a distance from the center: 90 mm)), respectively, as illustrated in FIG. 9, relative to the average value of the coating thicknesses calculated from the sheet resistances (Ω/□) measured at these 49 points was calculated in a percent (as a ratio of the coating thickness relative to the average coating thickness (in %)).

Evaluation Results on the Sputtering Target of Reference Example

Figure 10:
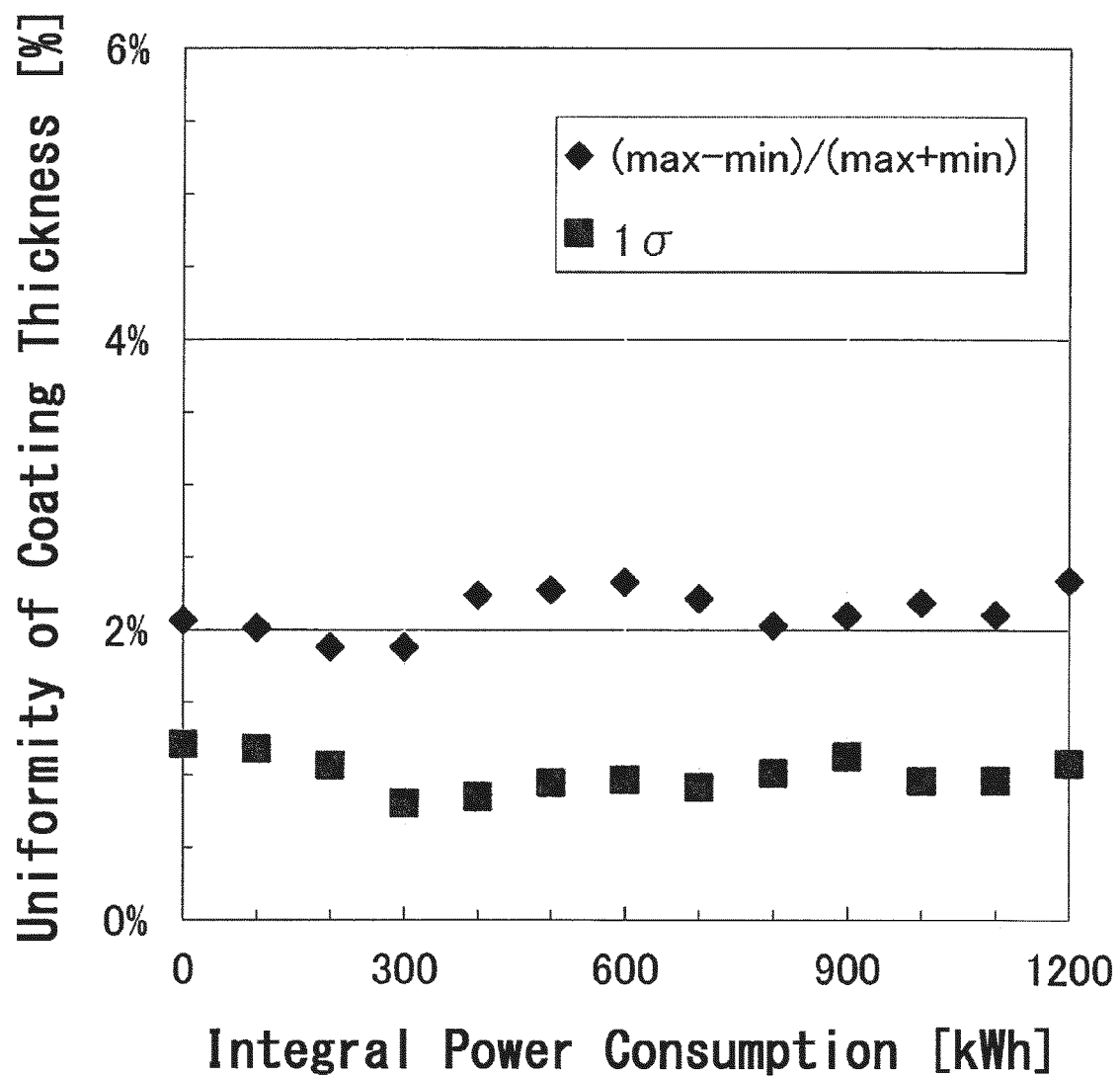
FIG. 10 is a graph illustrating uniformity of coating thickness wherein a sputtering target according to Reference Example (in a standard configuration) is employed.

As shown in the graph of FIG. 10, the sputtering target of the Reference Example in the standard configuration (using target material $T_0$ (see FIG. 4)) had an excellent uniformity of the coating thickness. However, its life was 1200 kWh, which was not well sufficient.

Figure 11:
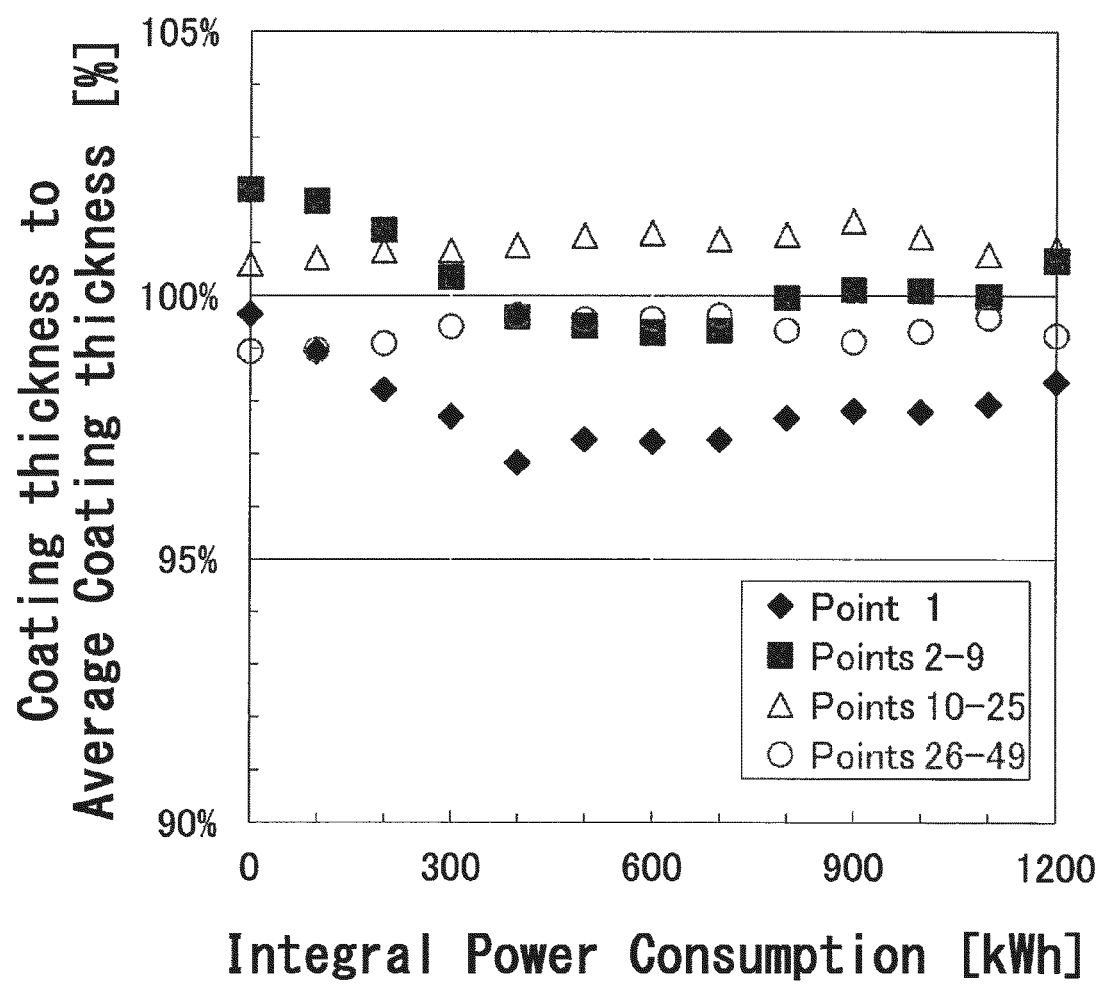
FIG. 11 is a graph illustrating coating thickness (%) relative to average coating thickness wherein a sputtering target according to Reference Example (in a standard configuration) is employed.

Moreover, as shown in the graph of FIG. 11, according to the sputtering target of the Reference Example in the standard configuration, all over the thin coating layer formed on the substrate (i.e., at all of the Points 1-49), the uniformity of the coating thickness can be ensured to some extent. However, it was found that the coating thickness was small at the central part (Point 1).

Evaluation Results on the Sputtering Target of Example 1

Figure 12:
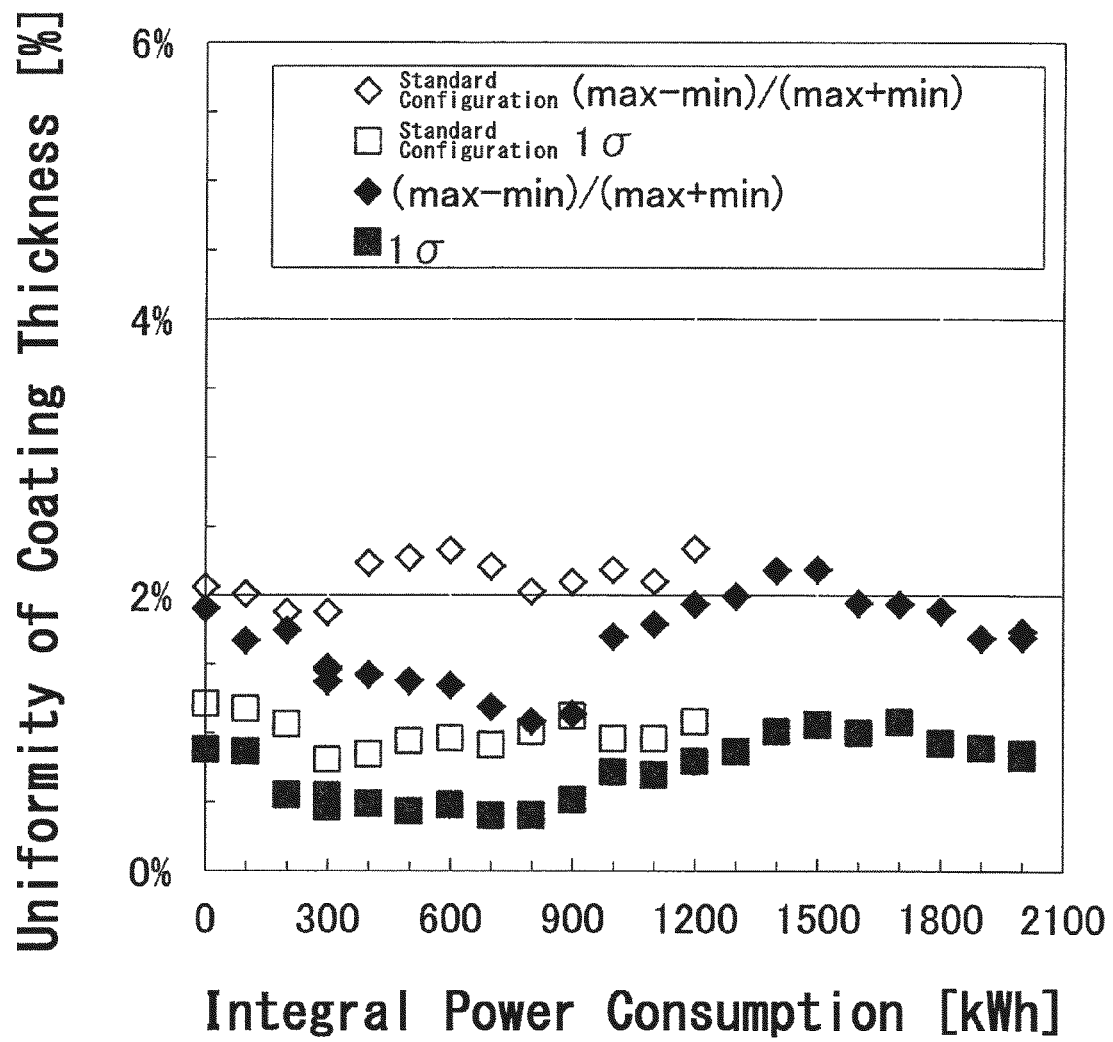
FIG. 12 is a graph illustrating uniformity of coating thickness wherein sputtering targets according to Example 1 and Reference Example (in a standard configuration) are employed.

As shown in the graph of FIG. 12, it was evidenced that the sputtering target of Example 1 according to the present invention (using target material T (see FIG. 2)) had a long life of 2000 kWh. Herein, the life of the sputtering target having the standard configuration according to the Reference Example was 1200 kWh (see FIGS. 10 and 12) as described above. Whereas, it was found that the sputtering target of Example 1 according to the present invention had 1.5 times or more of life of that of the sputtering target having the standard configuration according to the Reference Example.

Moreover, as shown in the graph of FIG. 12, it was found that the sputtering target of Example 1 according to the present invention had an excellent uniformity of the coating thickness all over the range from 0 to 2000 kWh in comparison with the sputtering target having the standard configuration according to the Reference Example as described above.

Figure 13:
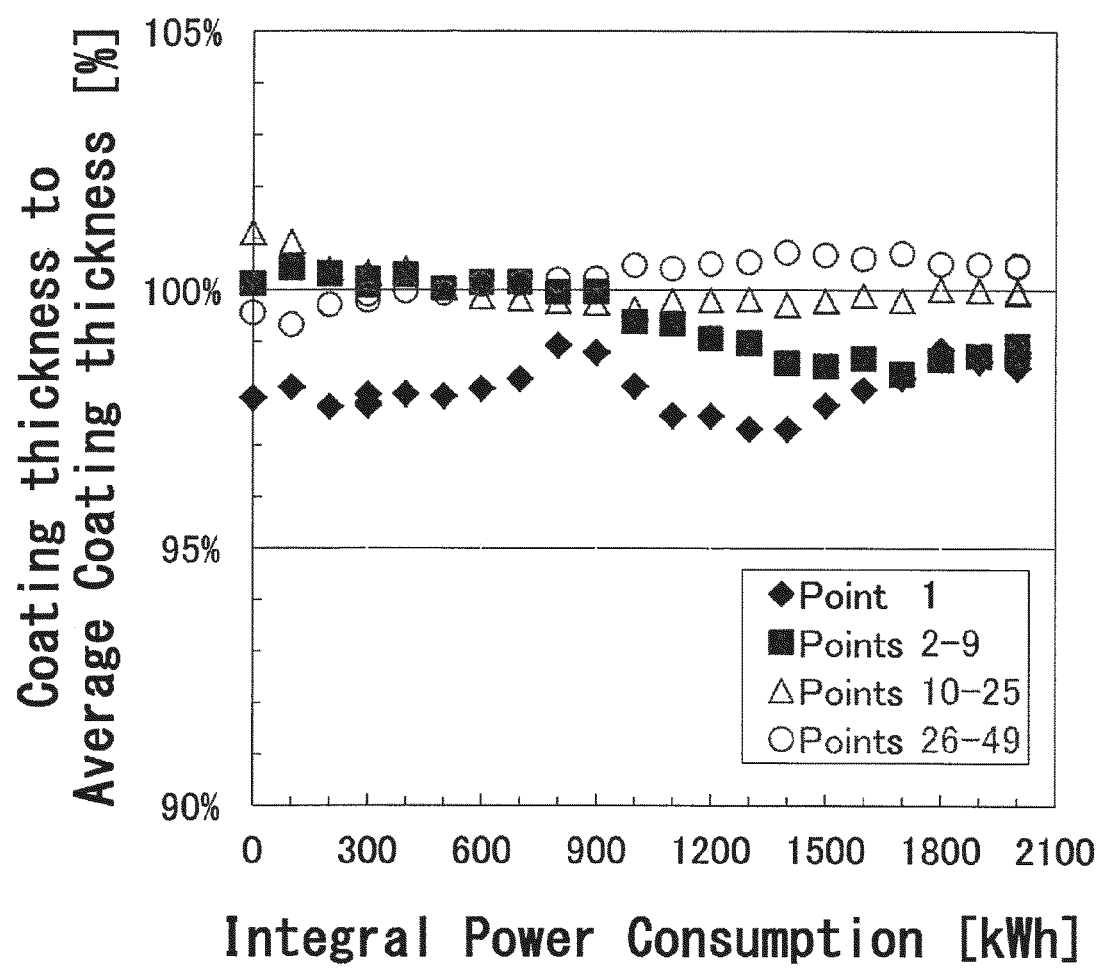
FIG. 13 is a graph illustrating coating thickness (%) relative to average coating thickness wherein a sputtering target according to Example 1 is employed.

Furthermore, as shown in the graph of FIG. 13, it was found that the sputtering target of Example 1 according to the present invention could provide an excellent uniformity of the coating thickness, all over the range from 0 to 2000 kWh, and all over the thin coating layer formed on the substrate.

Thus, it was found that the sputtering target of Example 1 according to the present invention had a long life of 2000 kWh, and could provide an excellent uniformity of the coating thickness, all over the life of the range from 0 to 2000 kWh, and all over the substrate.

Evaluation Results on the Sputtering Target of Comparative Example 1

Figure 14:
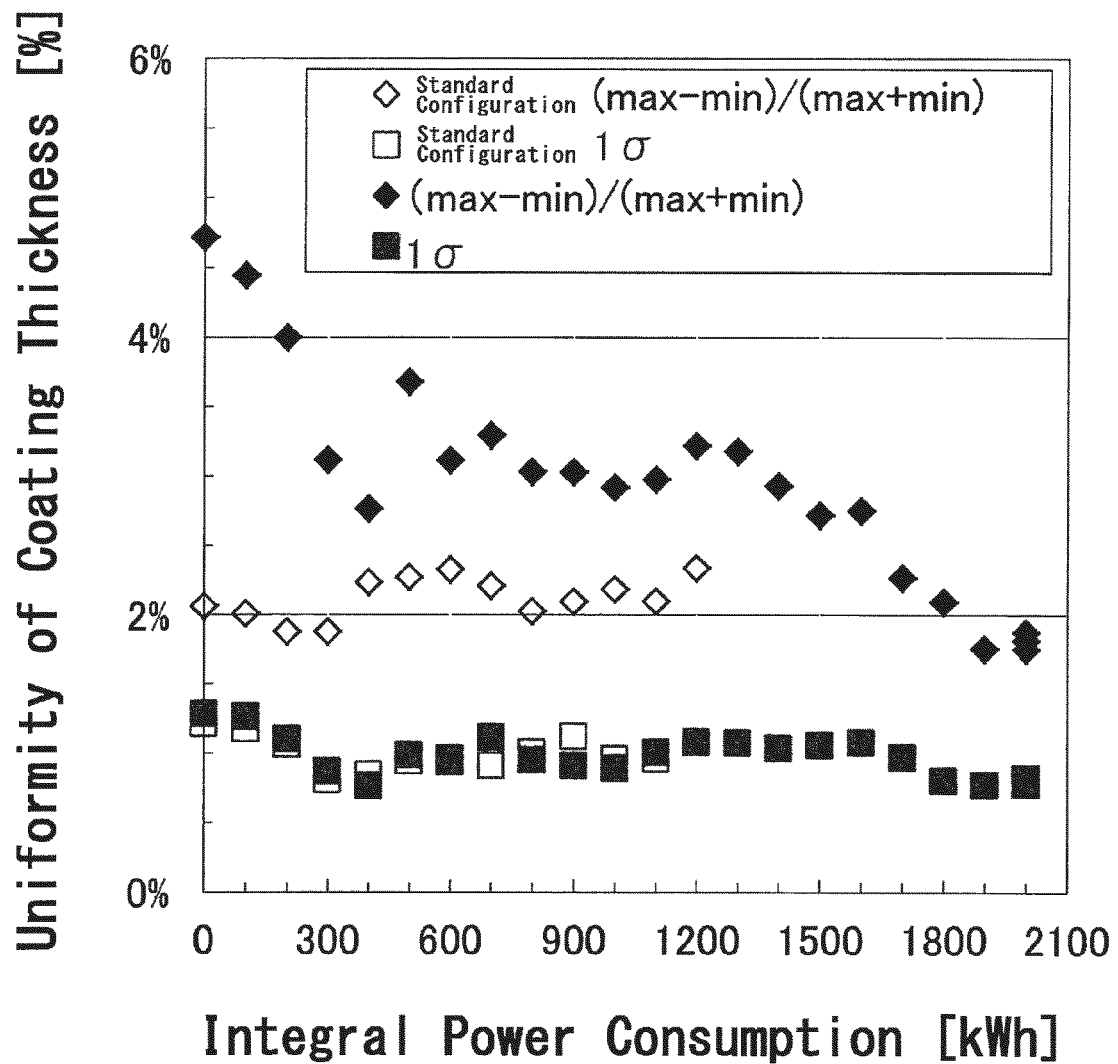
FIG. 14 is a graph illustrating uniformity of coating thickness wherein sputtering targets according to Comparative Example 1 and Reference Example (in a standard configuration) are employed.

As shown in FIG. 14, the sputtering target according to Comparative Example 1 (using target material $Tc_1$ (see FIG. 4)) could be subjected to the sputtering till 2000 kWh. However, it was found that, during its initial period, particularly from 0 to 300 kWh, the uniformity of the coating thickness was remarkably deteriorated.

Figure 15:
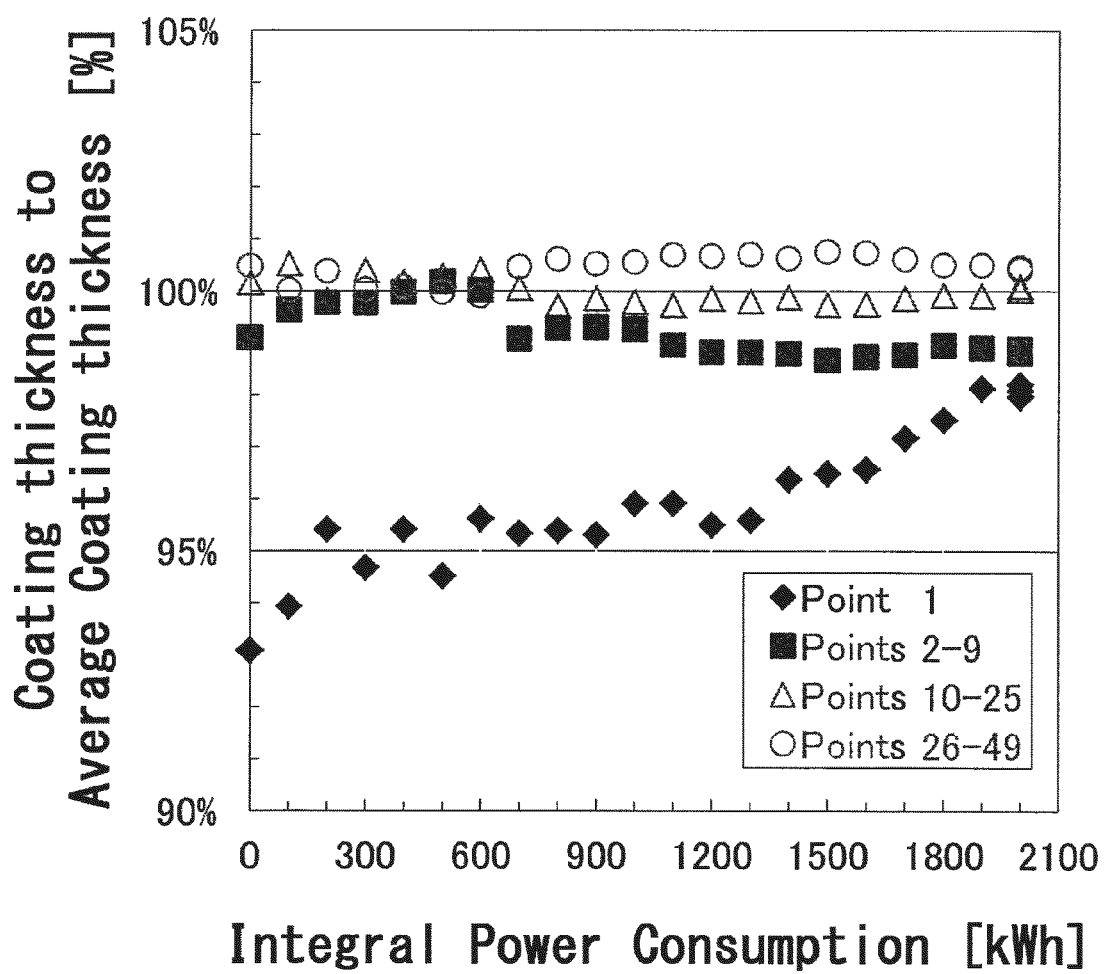
FIG. 15 is a graph illustrating coating thickness (%) relative to average coating thickness wherein a sputtering target according to Comparative Example 1 is employed.

As shown in FIG. 15, it was found that the sputtering target according to Comparative Example 1 had a small coating thickness at the central part of the substrate (Point 1). Particularly, during the initial period (from 0 to 300 kWh), it was found that the thickness of the coating on the substrate at the central part (Point 1) was significantly small.

Thus, it was found that, even if the thickness of the target material was simply and totally increased (see the target material $Tc_1$ of FIG. 4), the uniformity of the coating thickness was deteriorated during the initial period of the sputtering (from 0 to 300 kWh). Particularly, it was found that the coating thickness at the central part (Point 1) was significantly deteriorated.

Evaluation Results on the Sputtering Target Comparative Example 2

Figure 16:
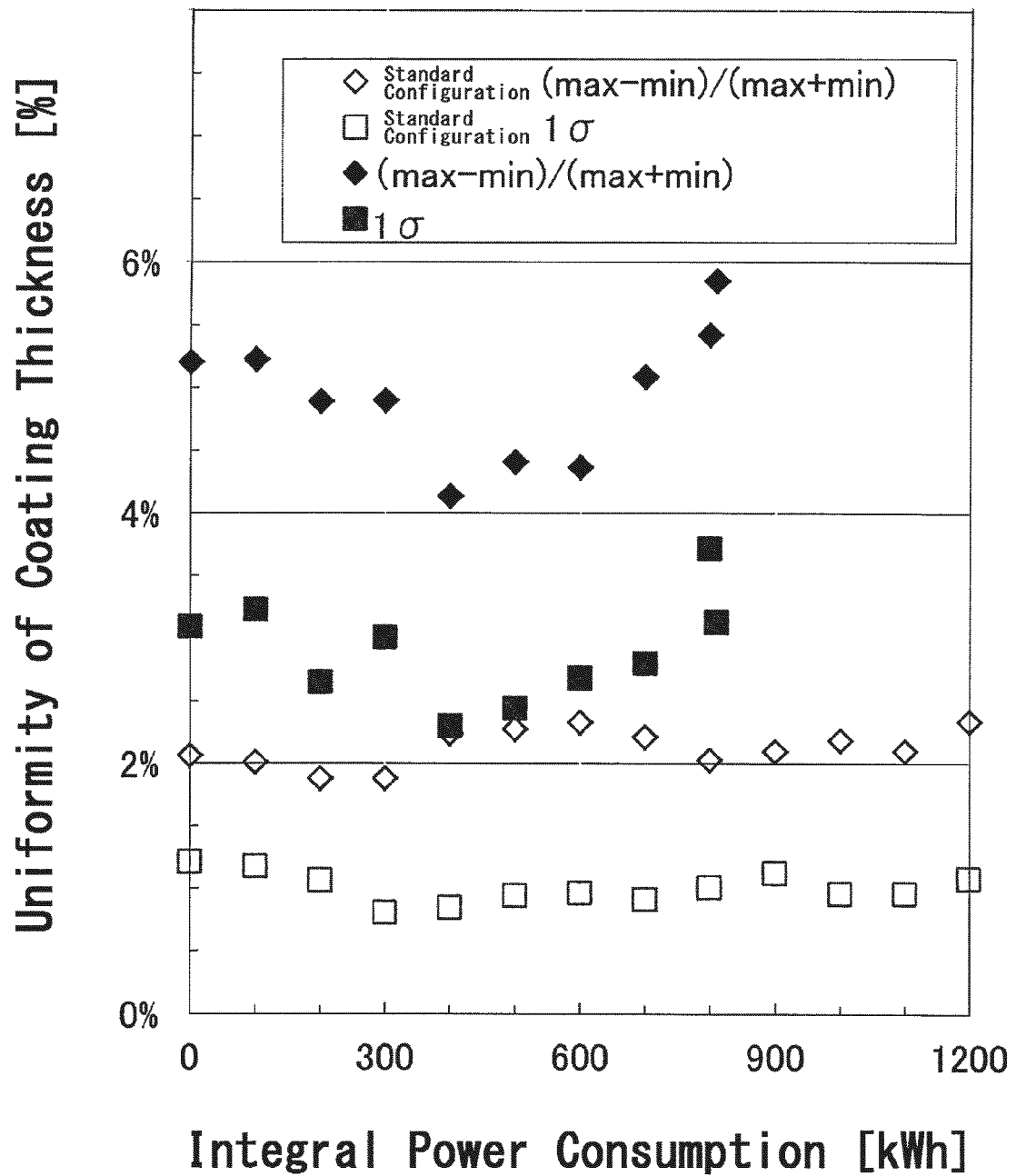
FIG. 16 is a graph illustrating uniformity of coating thickness wherein sputtering targets according to Comparative Example 2 and Reference Example (in a standard configuration) are employed.

As shown in FIG. 16, it was found that the sputtering target according to Comparative Example 2 (using target material $Tc_2$ (see FIG. 4)) had remarkably deteriorated uniformity of the coating thickness from/during the initial period immediately after the sputtering operation.

Furthermore, as shown in FIG. 16, the sputtering target according to Comparative Example 2 had significantly deteriorated uniformity of the coating thickness at/after 800 kWh (uniformity of coating thickness: (max−min)/(max+min)=5.4%; $1\sigma$=3.7%). Therefore, it was evidenced that the elongation of life of the sputtering target could not be achieved, even if the sputtering was further continued.

Figure 17:
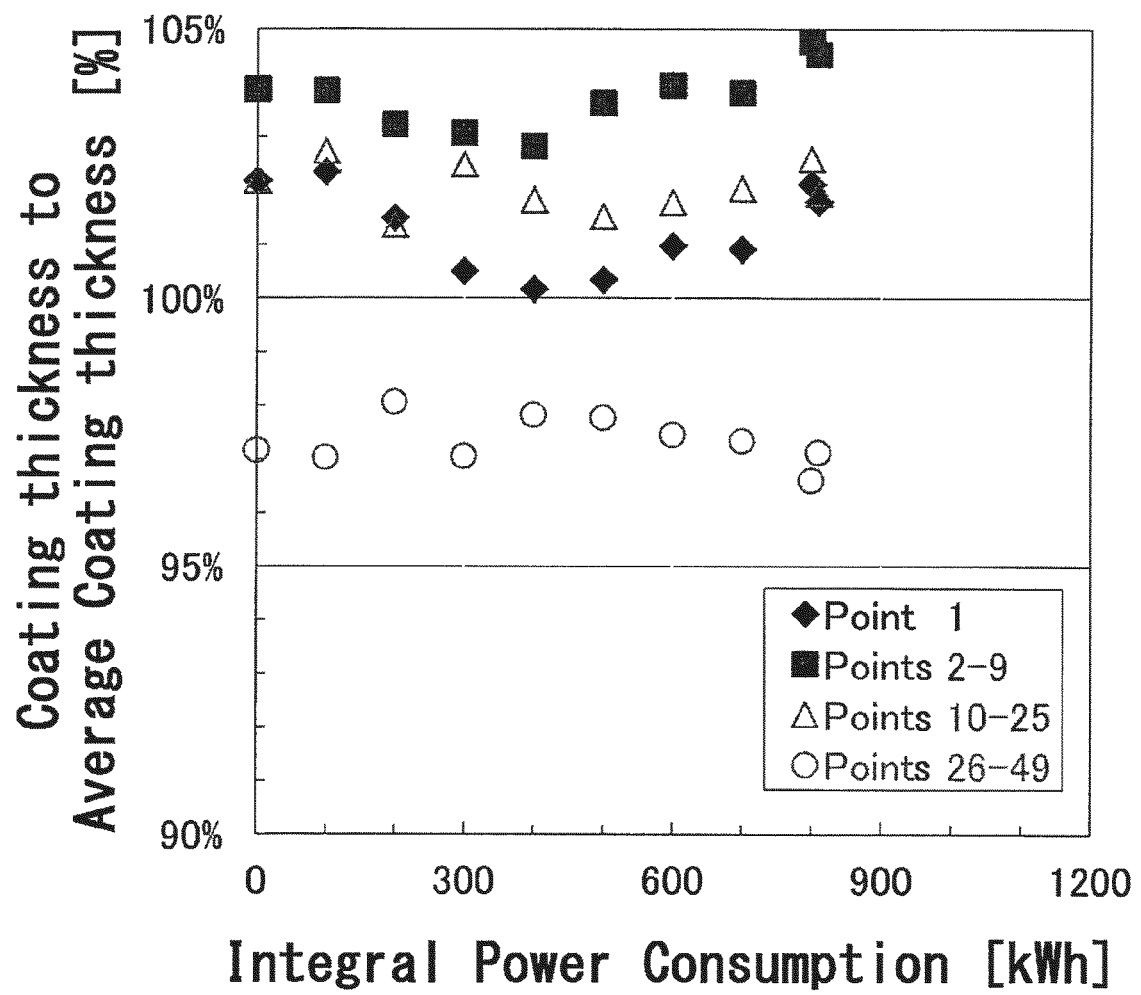
FIG. 17 is a graph illustrating coating thickness (%) relative to average coating thickness wherein a sputtering target according to Comparative Example 2 is employed.

Furthermore, as shown in FIG. 17, it was found that the sputtering target according to Comparative Example 2 had a small thickness of the thin coating layer formed on the substrate at its circumference (Points 26-49) after/during the initial period immediately after the sputtering operation, and that an uniform coating thickness could not be obtained all over the substrate.

Thus, it was found that, in the case that the thickness of the target material was simply and totally increased, and the step was formed on the peripheral part of the target material (see the target material $Tc_2$ of FIG. 4), the uniformity of the coating thickness was significantly deteriorated from/during the initial period of the sputtering.

Figure 18:
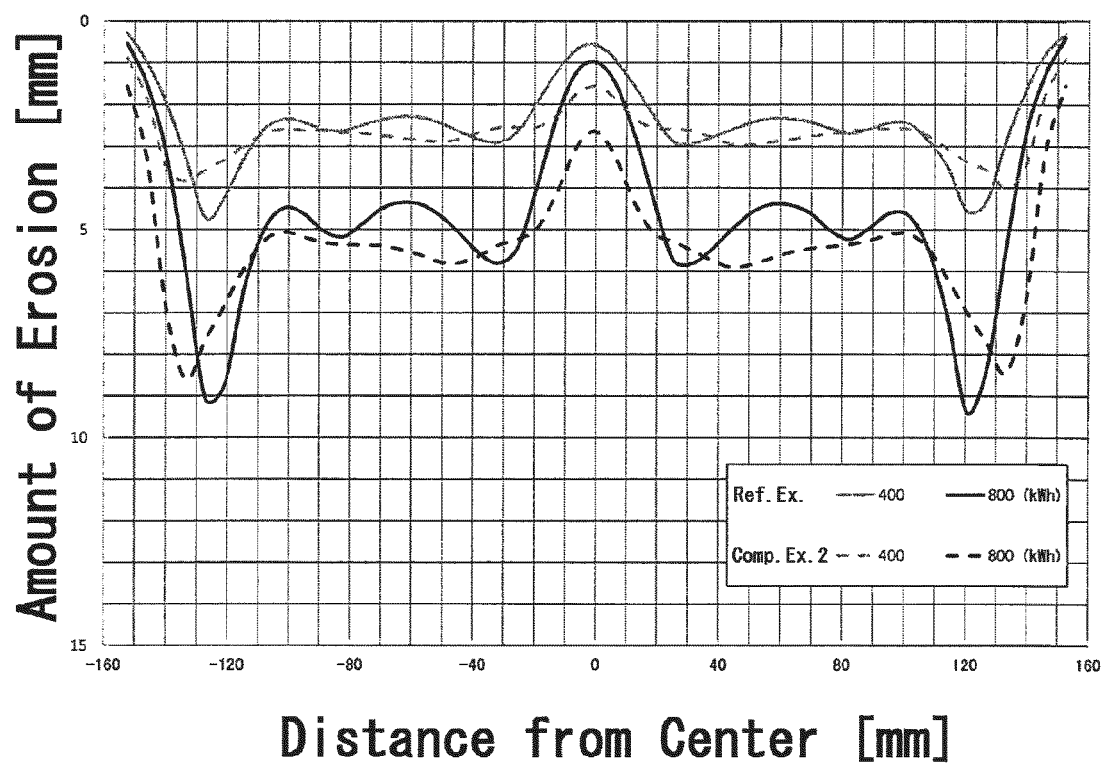
FIG. 18 is a graph illustrating amount of erosion of a target material for each of the sputtering targets according to Comparative Example 2 and Reference Example (in a standard configuration).

Moreover, FIG. 18 shows amount of erosion of the target material of the sputtering target according to Comparative Example 2. Regarding FIG. 18, the solid line represents amount of erosion of the target material of the sputtering target according to Reference Example. The broken line represents amount of erosion of the target material of the sputtering target according to Comparative Example 2 (at every 400 kWh among 0-800 kWh).

According to FIG. 18, it was found that the sputtering target according to Comparative Example 2 had the largest erosion part on the target material at a further outer area near the circumference in comparison with that of Reference Example. As a result, the sputtering amount is increased at a much further area apart from the circumference of the substrate, thus sputtered atom is spent without reaching to the circumference of the substrate (Points 26-49), and therefore, the coating thickness around the circumference of the substrate (Points 26-49) is decreased. These results consist with those shown in the graph of FIG. 17 as described above.

Evaluation Results on the Sputtering Targets According to Comparative Examples 3, 4 and 5

As shown in the following table, it was evidenced that each of the sputtering targets of Comparative Examples 3, 4 and 5 had the remarkably deteriorated uniformity of the coating thickness during the initial period (particularly at 100 kWh).

Evaluation Results on the Sputtering Target According to Comparative Example 6

As shown in the following table, it was found that, since the sputtering target according to Comparative Example 6 had the diameter of the first area, which was 32.6% of the circumferential diameter of the sputtering surface, the uniformity of the coating thickness was deteriorated in comparison with Example 1 wherein the diameter of the first area was 70.2% of the circumferential diameter of the sputtering surface.

TABLE 1

| | Uniformity of Coating Thickness | |
|---|---|---|
| | (max − min)/(max + min) (%) | 1σ (%) |
| Ex. 1 | 1.7 (100 kWh) | 0.9 (100 kWh) |
| | 1.7 (2000 kWh) | 0.8 (2000 kWh) |
| Comp. Ex. 2 | 5.2 (100 kWh) | 3.2 (100 kWh) |
| Comp. Ex. 3 | 9.0 (100 kWh) | 6.2 (100 kWh) |
| Comp. Ex. 4 | 4.4 (100 kWh) | 3.5 (100 kWh) |
| Comp. Ex. 5 | 7.0 (100 kWh) | 5.0 (100 kWh) |
| Comp. Ex. 6 | 2.2 (100 kWh) | 1.4 (100 kWh) |

Herein, it was also evidenced that, in the sputtering targets of Comparative Examples 3, 4 and 5, elongation of life of the sputtering target could not be achieved in the same manner as described in Comparative Example 2 above.

Investigation on Step

Herein, with respect to Reference Example using the target material having no step on its peripheral part (see FIG. 3, target material $T_0$), Example 1 according to the present invention (see FIG. 3, target material T), and Comparative Example 1 (see FIG. 4, target material $Tc_1$), the results of the uniformity of the coating thickness are summarized in the following table (see also results shown in FIGS. 10, 12 and 14).

TABLE 2

| | Uniformity of Coating Thickness | |
|---|---|---|
| | (max − min)/(max + min) (%) | 1σ (%) |
| Ref. Ex. | 2.0 (100 kWh) | 1.2 (100 kWh) |
| | 2.3 (1200 kWh) | 1.1 (1200 kWh) |
| Ex. 1 | 1.7 (100 kWh) | 0.9 (100 kWh) |
| | 1.7 (2000 kWh) | 0.8 (2000 kWh) |
| Comp. Ex. 1 | 4.4 (100 kWh) | 1.3 (100 kWh) |
| | 1.8 (2000 kWh) | 0.8 (2000 kWh) |

From these results, as it can be seen in Example 1, it is also demonstrated that an excellent uniformity of the coating thickness can be obtained in the case that the target material has no step on its peripheral part. Particularly, according to Example 1 of the present invention, it can be seen that the uniformity of the coating thickness is surprisingly improved, in comparison with Reference Example and Comparative Example 1, in both of the initial period and the long term period, particularly in the initial period.

Therefore, it is demonstrated that, regarding the improvements in the elongated life of the sputtering target and the uniformity of the coating thickness, it is better to provide no step on the peripheral part of the target material.

The values of 1σ at 100 kWh regarding Reference Example and Comparative Example 1 are 1.2% (in Reference Example) and 1.3% (in Comparative Example 1), respectively. In both case, the uniformity of the coating thickness seems to be good. However, Comparative Example 1 had the significantly deteriorated uniformity of the coating thickness during the initial period (from 0 to 300 kWh) as explained in FIGS. 14 and 15 above. Moreover, as shown in FIG. 15, only the coating thickness at the central point (Point 1) among the 49 measured points was significantly decreased particularly during the initial period (from 0 to 300 kWh). These results are due to the fact that the values of 1σ apparently seem to allow the uniformity of the coating thickness to be good since the coating thickness at the central point (Point 1) scarcely influences on the calculations for the values of 1σ. Therefore, from these points, it was also found that the evaluation on the uniformity of the coating thickness based on the values of 1σ was not appropriate so much.

Investigation on Elongation of Life Regarding Erosion Amount of Target Material

Figure 19:
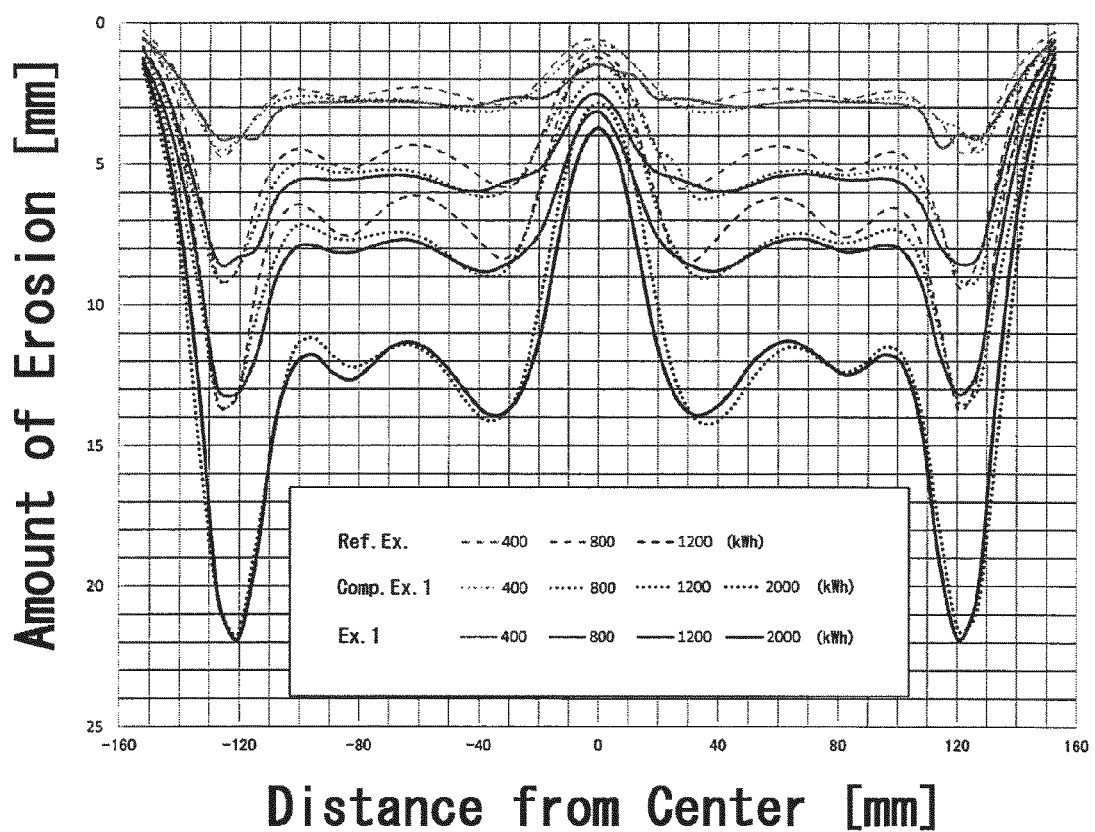
FIG. 19 is a graph illustrating amount of erosion of a target material for each of the sputtering targets according to Reference Example (in a standard configuration), Comparative Example 1, and Example 1.

FIG. 19 shows erosion amount of the target material, which was measured on each of the sputtering targets of Reference Example, Comparative Example 1 and Example 1. The broken line represents erosion at Reference Example. The dotted line represents erosion at Comparative Example 1, and the solid line represents erosion at Example 1. Herein, the erosion amount was measured at 400, 800, 1200 and 2000 kWh, from 400 to 2000 kWh, respectively, with the proviso that the erosion amount was investigated till 1200 kWh for Reference Example.

In view of the graph of FIG. 19, it was found that the erosion amount was increased over the area from 70 mm to 125 mm from the center on the sputtering target of Example according to the present invention, particularly, from the area in a distance of about 90 mm from the center (i.e., about 56.4% of the radius (159.57 mm) of the sputtering surface) to the area in a distance of about 125 mm from the center (i.e., about 78.3% of the radius (159.57 mm) of the sputtering surface).

Therefore, it was found that elongation of life of the target material, and excellent uniformity of the coating thickness could be achieved by providing the first area according to the present invention over the area from 60% to 80% of the circumferential diameter of the sputtering surface.

Investigation on Improvement of Uniformity of Coating Thickness

From the results of Reference Example, Comparative Example and Comparative Example 2, it was found that the uniformity of the thickness of the thin coating layer formed on the substrate was not improved by simply increasing the thickness of the sputtering surface only (FIGS. 10, 11 and 14-17).

Moreover, in view of the graphs shown in FIGS. 11 and 15, it was evidenced that the coating thickness of the thin coating layer formed on the substrate at the central part (Point 1) was extremely small during the initial period of the sputtering (particularly from 0 to about 300 kWh) (particularly, in the case of target material $Tc_1$ of Comparative Example 1 as shown in FIG. 15).

Herein, in the case that the target material $Tc_1$ according to Comparative Example 1 was employed, the reasons why thickness of the thin coating layer thus formed on the substrate at the central part (Point 1) was extremely small are believed in that the increase in the thickness of the target material shortened the distance between the target material and the substrate (TS distance), and then, as shown in FIG. 19, the area around the circumference of the target material was deeply consumed, and therefore, the thickness of the coating layer formed on the area around the circumference of the substrate was increased, the amount of the coating layer formed on the central part (Point 1) of the substrate was relatively small.

Figure 20:
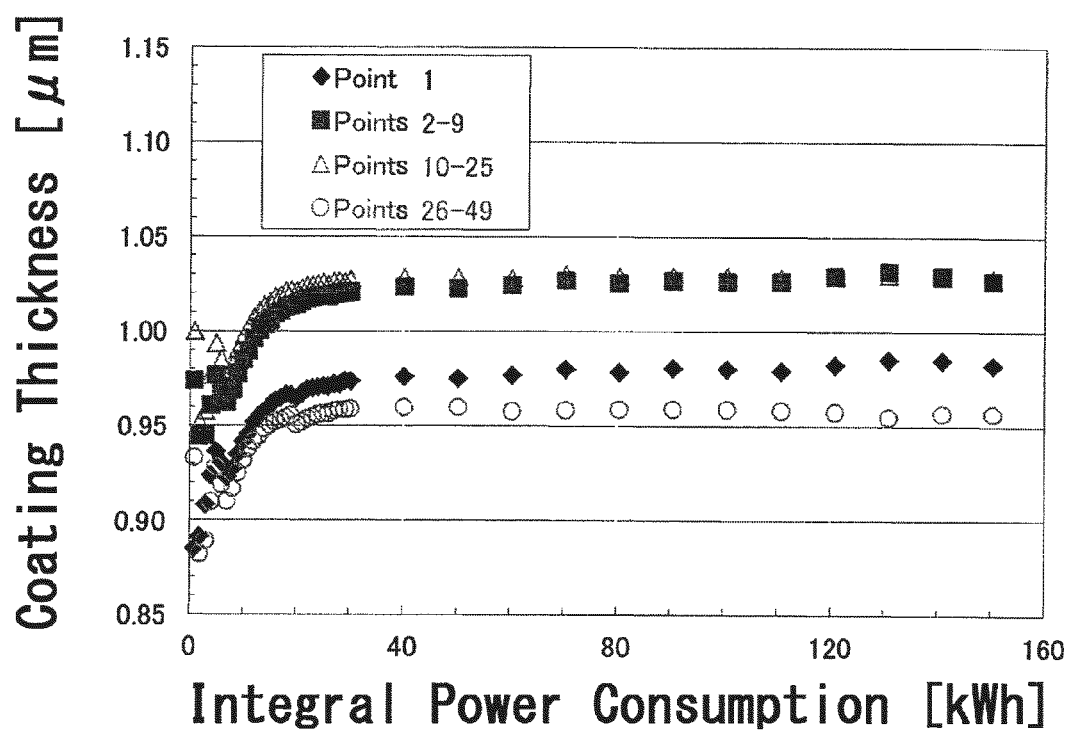
FIG. 20 is a graph illustrating a relation between an integral power consumption and a thickness of a thin coating layer formed on a substrate with respect to a sputtering target according to Comparative Example 4.
Figure 21:
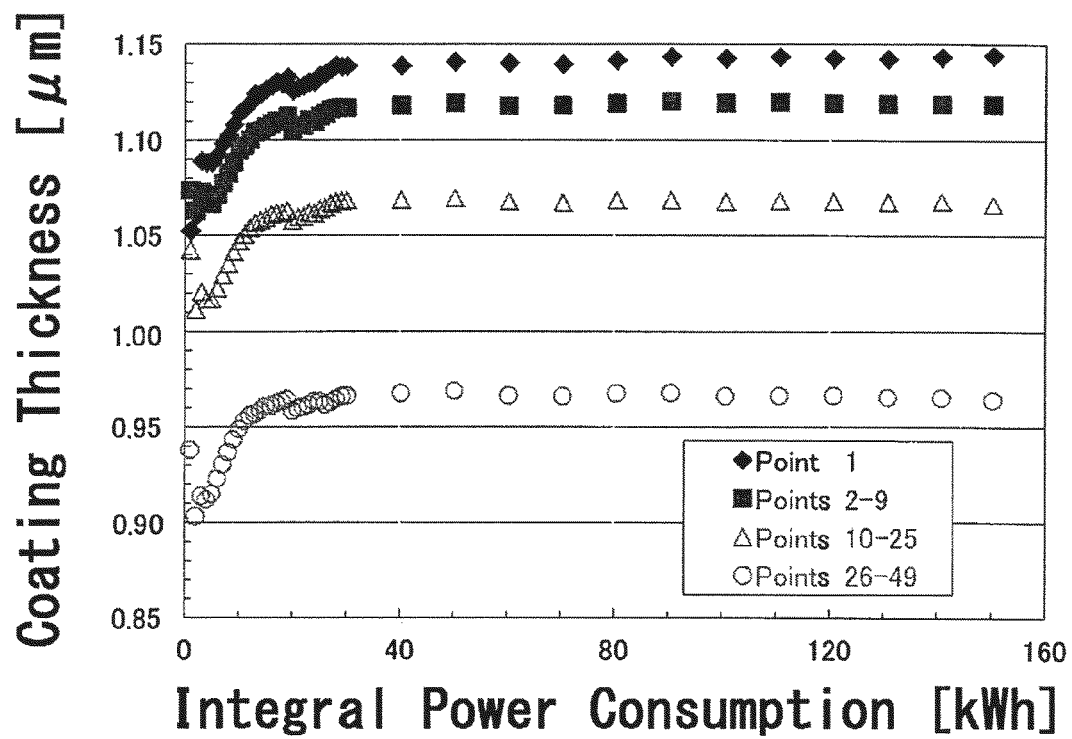
FIG. 21 is a graph illustrating a relation between an integral power consumption and a thickness of a thin coating layer formed on a substrate with respect to a sputtering target according to Comparative Example 3.

Furthermore, as shown in FIGS. 20 and 21, during the extremely initial period of the sputtering (particularly from 0 to 160 kWh), it was evidenced that, in Comparative Example 3 (using target material $Tc_3$) as shown in FIG. 21, the thickness of the thin coating layer formed at the central part (Point 1) of the substrate was increased in comparison with Comparative Example 4 (using target material $T_{c4}$) as shown in FIG. 20.

This seems to be caused by that, in Comparative Example 4 (using target material $T_{c4}$) as shown in FIG. 20, the area around the center is thickened due to the ring-shaped protrusion formed around the center of the sputtering surface, and that, in the contrastive Comparative Example 3 (using target material $T_{c3}$) as shown in FIG. 21, the area around the center of the sputtering surface is flat over a given range (FIG. 5).

Therefore, it was found that, in the case that the central part of the sputtering surface was flat over a given area, preferably over an area ranging from 60% to 80% of the circumferential diameter of the sputtering surface as described above (FIG. 19), the thickness of the thin coating layer formed on the substrate at the central part (Point 1) was increased during the initial period of the sputtering, and the uniformity of the coating thickness could be improved.

Herein, the results shown in FIGS. 20 and 21 described above suggest an existence of any correlation between the thickness at the central part of the sputtering target and the thickness of the thin coating layer formed on the substrate at the central part (Point 1).

Herein, in the sputtering target of Example 1 according to the present invention as shown in FIG. 2, $d_1$ is altered, thereby, thickness $d_2$ is altered at the central part of the target material, and the thickness of the thin coating layer formed on the substrate was measured during the initial period (particularly at 100 kWh). The results are shown in FIG. 22.

Figure 22:
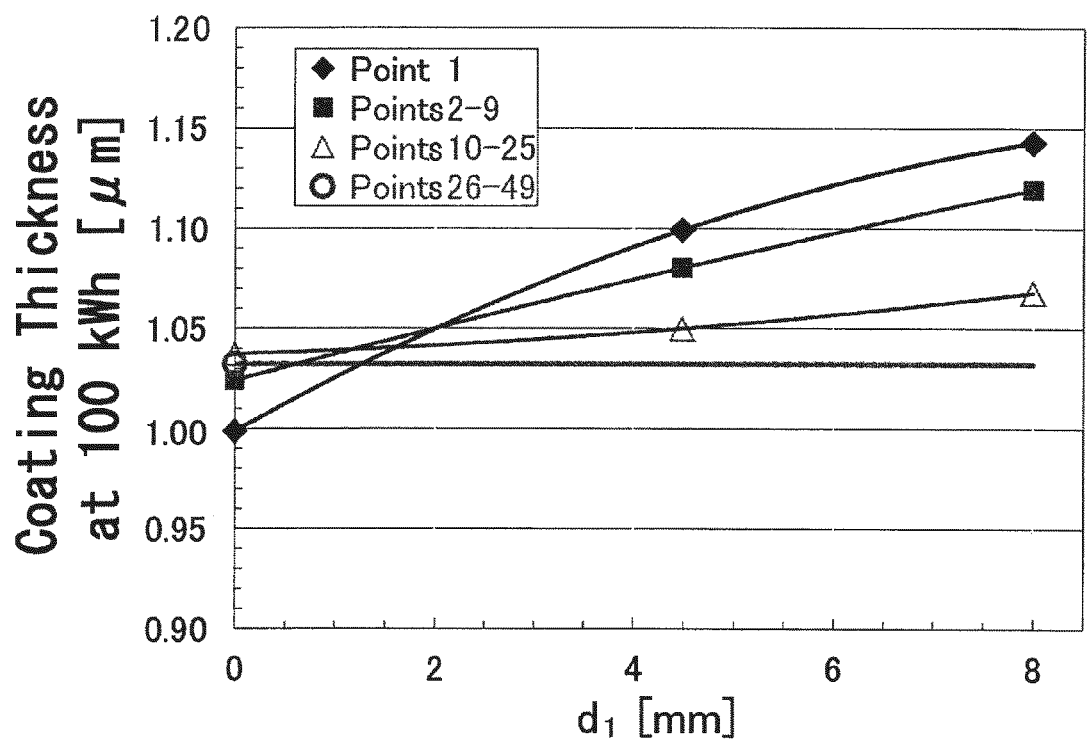
FIG. 22 is a graph illustrating a relation of a distance $d_1$ (mm) between the first and second areas relative to a thickness of a thin coating layer formed on a substrate at 100 kWh.

In view of the results shown in FIG. 22, it was evidenced that, with the value of $d_1$ being decreased from 8 mm, values of the coating thicknesses at these points were converged, and therefore, the uniformity of the coating thickness was improved. It was evidenced that, especially, at $d_1$ of 4.0 mm or less, particularly at 1.65 mm, the uniformity of the coating thickness was significantly improved.

Therefore, the value of $d_1$ was preferably set at 4.0 mm or less. Thus, the first area was positioned at a location lower than that of the second area by 15% of thickness of the second area at most. Thereby, the uniformity of the thickness of the thin coating layer formed on the substrate could be improved.

The present application is a U.S. national stage application of International Patent Application No. PCT/JP2015/051395, filed Jan. 20, 2015, which claims the benefit of priority to Japanese Patent Application No. 2014-008740 filed on Jan. 21, 2014, the disclosures of which are incorporated herein by reference in their entireties.

INDUSTRIAL APPLICABILITY

The sputtering target according to the present invention can be utilized in a commercially available sputtering apparatus, particularly in a magnetron sputtering apparatus. The sputtering target provides a long life of 1800 kWh or more, as an integral power consumption, and, during the period, a thin coating layer with an excellent uniformity of its coating thickness can be formed on a substrate. Therefore, the sputtering target according to the present invention has benefits.

EXPLANATIONS OF LETTERS OR NUMERALS

1: first area
2: second area
3: intermediate area between first and second areas (or inner surrounding part of second area)
4: back surface of target material (or surface oppose to sputtering surface)
5: peripheral part of target material
6: support member
7: flange part
8: outer surrounding part of second area
9: step formed on peripheral part of target material
10: sputtering target according to the present invention
101: planar area (as sputtering surface) of target material $T_{c1}$ of sputtering target according to Comparative Example 1
102: planar area of target material $T_{c2}$ of sputtering target according to Comparative Example 2
103: central planar area of target material $T_{c3}$ of sputtering target according to Comparative Example 3
104: central planar area of target material $T_{c4}$ of sputtering target according to Comparative Example 4
105: outer planar area of target material $T_{c4}$ of sputtering target according to Comparative Example 4
201: ring-shaped planar area of target material $T_{c3}$ of sputtering target according to Comparative Example 3
202: outer ring-shaped planar area among double rings of target material $T_{c4}$ of sputtering target according to Comparative Example 4
203: inner ring-shaped planar area among double rings of target material $T_{c4}$ of sputtering target according to Comparative Example 4
S: sputtering surface
T: target material
$T_0$: target material in standard configuration
$T_{c1}$-$T_{c6}$: target material of sputtering target of each of Comparative Examples 1-6
x: part of target material jointed or to be jointed with support member

The invention claimed is:
1. A sputtering target comprising a target material,
wherein the target material has a sputtering surface having
a first area placed at the center, which is circular and flat; and
a second area placed outside of the first area and concentrically with the first area, which has a ring shape,
wherein the first area is positioned at a location lower than that of the second area by 1 mm or more and less than 2 mm, and the first area has a diameter which is ranging from 60% to 75% of a circumferential diameter of the sputtering surface, the first area excludes an area of the largest erosion amount, and the area of the largest erosion amount is within a range larger than 60% but not large than 78.3% of the circumferential diameter of the sputtering surface,
wherein the angle of inclination formed between the first area and the second area is greater than or equal to 15° and less than or equal to 60° and
wherein the target material has no step at its peripheral part,
wherein the first area of the target material has a thickness from 20 mm to 30 mm,
wherein the target material has a back surface, which is opposite to the sputtering surface and the back surface of the target material has a conical cavity,
wherein the target material has a tapered peripheral surface that extends from the sputtering surface to the back surface and wherein a depth of the conical cavity at an apex of the conical cavity is from 1 mm to 3 mm.

2. The sputtering target according to claim 1, wherein the first area is positioned at a location lower than that of the second area by from 4% to 12% of thickness of the second area.

3. The sputtering target according to claim 1, wherein the second area of the target material has a thickness from 25 mm to 35 mm.

4. The sputtering target according to claim 1, wherein that the target material is composed of aluminum or aluminum alloy.

5. A sputtering target comprising a target material, wherein the target material has a sputtering surface having a first area placed at the center, which is circular and flat; and
a second area placed outside of the first area and concentrically with the first area, which has a ring shape,
wherein the first area is positioned at a location lower than that of the second area by 1 mm or more and less than 2 mm, and the first area has a diameter which is ranging from 60% to 75% of a circumferential diameter of the sputtering surface, the second area includes an area of largest erosion amount wherein there is no step at the outer peripheral part of the second area and the area of the largest erosion amount is within a range larger than 60% but not large than 78.3% of the circumferential diameter of the sputtering surface,
wherein the first area of the target material has a thickness from 20 mm to 30 mm,
wherein the target material has a back surface, which is opposite to the sputtering surface and the back surface of the target material has a conical cavity,
wherein the target material has a tapered peripheral surface that extends from the sputtering surface to the back surface and
wherein a depth of the conical cavity at an apex of the conical cavity is from 1 mm to 3 mm.

6. The sputtering target according to claim 5, wherein the first area is positioned at a location lower than that of the second area by from 4% to 12% of thickness of the second area.

7. The sputtering target according to claim 5, wherein the second area of the target material has a thickness from 25 mm to 35 mm.

8. The sputtering target according to claim 5, wherein the target material is composed of aluminum or aluminum alloy.

9. A sputtering target comprising a target material, wherein the target material has a sputtering surface having a first area placed at the center, which is circular and flat; and
a second area placed outside of the first area and concentrically with the first area, which has a ring shape,
wherein the first area is positioned at a location lower than that of the second area by 1 mm or more and less than 2 mm, and the first area has a diameter which is ranging from 60% to 75% of a circumferential diameter of the sputtering surface, the second area includes no step at the outer peripheral part of the second area,
wherein the an angle of inclination formed between the first area and the second area is greater than or equal to 15° and less than or equal to 60°,
wherein the first area of the target material has a thickness from 20 mm to 30 mm,
wherein the target material has a back surface, which is opposite to the sputtering surface and the back surface of the target material has a conical cavity,
wherein the target material has a tapered peripheral surface that extends from the sputtering surface to the back surface and
wherein a depth of the conical cavity at an apex of the conical cavity is from 1 mm to 3 mm.

10. The sputtering target according to claim 9, wherein the first area is positioned at a location lower than that of the second area by from 4% to 12% of thickness of the second area.

11. The sputtering target according to claim 9, wherein the second area of the target material has a thickness from 25 mm to 35 mm.

12. The sputtering target according to claim 9, wherein the target material is composed of aluminum or aluminum alloy.

13. The sputtering target according to claim 1, wherein the target provides a thickness uniformity of a coating sputtered from the target for each point of a period being 1800 kWh or more of less than 4%.

14. The sputtering target according to claim 5, wherein the target provides a thickness uniformity of a coating sputtered from the target for each point of a period being 1800 kWh or more of less than 4%.

15. The sputtering target according to claim 9, wherein the target provides a thickness uniformity of a coating sputtered from the target for each point of a period being 1800 kWh or more of less than 4%.

* * * * *